(12) United States Patent
Sumida et al.

(10) Patent No.: US 6,512,187 B2
(45) Date of Patent: Jan. 28, 2003

(54) LATTICE-SHAPED CIRCUIT BOARD

(75) Inventors: Tatsuya Sumida, Yokkaichi (JP); Masanobu Sato, Toyota (JP); Kazuhiro Aoki, Toyota (JP)

(73) Assignee: Sumitomo Wiring Systems, Ltd. (JP)

( * ) Notice: Subject to any disclaimer, the term of this patent is extended or adjusted under 35 U.S.C. 154(b) by 0 days.

(21) Appl. No.: 09/902,357

(22) Filed: Jul. 10, 2001

(65) Prior Publication Data

US 2001/0040049 A1 Nov. 15, 2001

Related U.S. Application Data

(62) Division of application No. 09/416,021, filed on Oct. 8, 1999, now Pat. No. 6,353,190.

(30) Foreign Application Priority Data

Oct. 9, 1998 (JP) .......................................... 10-288531
Oct. 13, 1998 (JP) .......................................... 10-290826
Oct. 13, 1998 (JP) .......................................... 10-290844

(51) Int. Cl.[7] ........................... H05K 1/11; H01R 12/04
(52) U.S. Cl. ....................... 174/261; 174/251; 174/267; 174/68.2; 174/117 F; 361/775; 361/777
(58) Field of Search ................................. 174/261, 267, 174/68.2, 70 B, 72 B, 99 B, 251, 117 M, 117 F; 361/775, 777, 780

(56) References Cited

U.S. PATENT DOCUMENTS

| | | | | |
|---|---|---|---|---|
| 3,899,237 A | * | 8/1975 | Briggs, Jr. | 339/99 |
| 4,764,644 A | * | 8/1988 | Reisman et al. | 174/68.5 |
| 4,899,439 A | * | 2/1990 | Potter et al. | 174/255 |
| 5,478,244 A | * | 12/1995 | Maue et al. | 439/76.2 |
| 5,544,018 A | * | 8/1996 | Sinnerfuekdt et al. | 361/792 |
| 5,742,005 A | * | 4/1998 | Saka et al. | 174/52.1 |
| 5,782,651 A | * | 7/1998 | Konoya | 439/405 |
| 5,928,004 A | * | 7/1999 | Sumida et al. | 439/76.2 |
| 6,353,190 B1 | | 3/2002 | Sumida et al. | |

* cited by examiner

Primary Examiner—David L. Talbott
Assistant Examiner—I B Patel
(74) Attorney, Agent, or Firm—Bierman, Muserlian and Lucas

(57) ABSTRACT

A circuit board assembly containing two pluralities of busbars or wires arranged in a lattice configuration, there being electrical continuity at each of the intersecting points. Slits are provided on each of the busbars which engage each other to complete the lattice. In the case of wires, they are bonded to each other. The conductive member thus formed may be sandwiched between two insulative films and is placed on an insulative plate which, in turn, is enclosed by an electrical connection box. The configuration provides substantial advantages in economy of production, simplified equipment required, and ease of altering the circuitry.

3 Claims, 22 Drawing Sheets

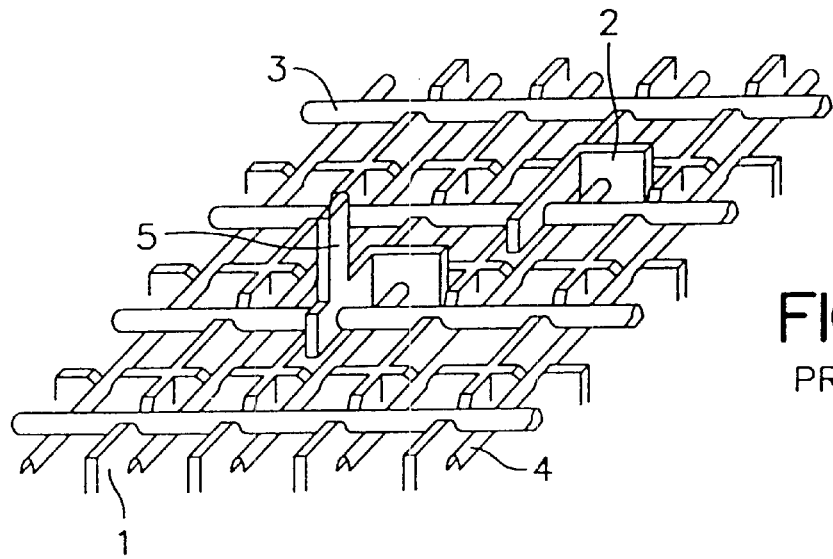
FIG. 12A
PRIOR ART
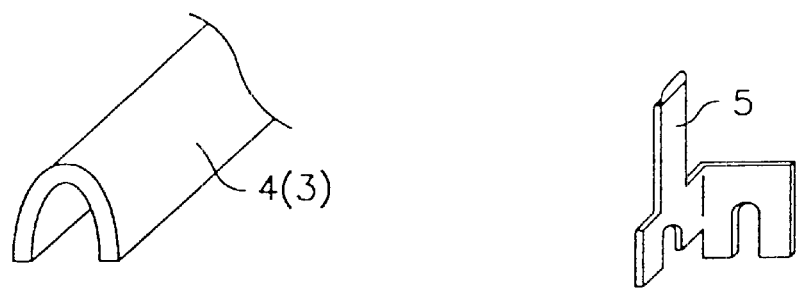
FIG. 12B
PRIOR ART
FIG. 12C
PRIOR ART
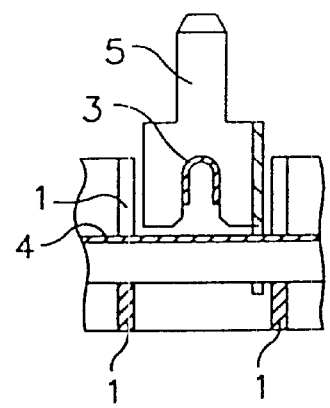
FIG. 12D
PRIOR ART

LATTICE-SHAPED CIRCUIT BOARD

This is a division of Ser. No. 09/416,021, filed on Oct. 8, 1999, now patented, U.S. Pat. No. 6,353,190.

This Application claims the benefit of the priority of Japanese Applications 10-288,531, filed Oct. 9, 1998; 10-290,826, filed Oct. 13, 1998; and 10-290,844, filed Oct. 13, 1998.

The present Invention is directed to a circuit board assembly for enclosure in an electrical connection box. The Invention is more particularly directed to an internal circuit assembly in a lattice configuration with vertical or horizontal busbars or wires connected to each other directly and by means of solderless terminals. The Invention will be described with reference to an automobile circuit board, but it is not to be limited thereto.

BACKGROUND OF THE INVENTION

In the past, busbars formed from conductive metal plates have been stamped in the shape of the desired circuit by using a die. Such circuits have been used as the wiring means for, in particular, automotive junction boxes. Alternatively, in place of the busbars, wires have been laid along circuits on an insulative plate, with solderless terminals being fixed to these wires to form solderless connections.

When busbars are used, a vertical busbar is bent from a conductive metal plate into the shape of the desired circuit and is aligned with the circuit on an insulative plate. The wires are preferably solid core and are laid along the circuit on the insulative circuit board and the solderless terminals are fixed to the wires to provide good electrical contact.

However, when circuitry of the foregoing type is provided, a die must be produced based upon each particular circuit desired. As a result, changes in the circuit are both difficult and costly to implement. Moreover, recent trends towards increased numbers of electronic parts has engendered a rapid increase in the number of circuits to be contained within the electrical connection boxes. It is often necessary to have seven or eight horizontal busbars disposed in multiple layers with insulative plates interposed. This leads to larger size and increased costs.

Moreover, the larger number of circuits requires complicated designs for the insulative plates on which the wires or busbars are placed. This makes the production of the insulative plates time-consuming and, in addition, requires substantial investments for the equipment necessary. When vertical busbars are used, they are formed integrally with tabs for connections to external circuits.

Thus, the busbars must be stamped with dies and, after this step is complete, must then be bent into the shape of the circuits. This increases the number of processing steps and further adds to the expense and difficulty in making any changes.

In an attempt to solve these problems, a number of structures have been proposed. Japanese OPI 60-35911 suggests the electrical connection box as shown in FIGS. 12(A), 12(B), 12(C), and 12(D). Unit case 1 is formed of lattice-shaped insulative material. Lateral conductive wires 3 and longitudinal conductive wires 4 have upside-down U-shaped cross-sections. At appropriate intersections, L-shaped solderless terminals 2 and tabbed solderless terminals 5 are engaged and connected to lateral conductive wires 3 and longitudinal conductive wires 4 to form the desired circuitry.

With the foregoing structure, circuits are formed by using solderless terminals 2 and 5 to connect the lateral and longitudinal conductive wires 3 and 4. Thus, circuit changes can be easily implemented simply by changing the positions of the solderless terminals. However, the lateral and longitudinal conductive wires are formed with the unique U-shaped cross sections which do not permit the use of standard solid core wires and also add to the cost. Moreover, wires 3 and 4 tend to deform when a load is applied, so that the opening of the U-shape is narrowed. Once this takes place, the connection between solderless terminals 2 and 5 and lateral and longitudinal conductive wires 3 and 4 becomes loose, whereby reliable electrical contact is not maintained.

Another attempt at solving the foregoing problems is to be found in Japanese OPI 56-130989. As shown in FIG. 23(A) and 23(B), circuit board 30, intended to be enclosed in an electrical connection box (not shown), is provided with stamped sections 33 which are stamped out of a conductive metal plate to form conductive lattice 34. Insulative sheets 32 are laminated on either side of the conductive lattice. To connect circuit board 30 with external circuits, wires are connected to the perimeter of conductive lattice 34.

In this structure, the circuits are formed by cutting out unneeded sections 37. Changes in such circuits can be implemented without undue difficulty, but there is no improvement in yield for the conductive metal plate, since the circuit is formed by stamping and there are many stamped sections 33. Wires can only be connected to the perimeter of conductive lattice 34; thus, the external circuits cannot be directly electrically linked to inner portions thereof. As a result, the connections are both complex and inefficient.

A further attempt to solve the foregoing problems is to be found in Japanese OPI 60-35912 as shown in FIGS. 34(A), 34(B), and 34(C). The insulative plate is in the form of unit case 1 which comprises lateral and longitudinal frames 61 and 62 which intersect each other at approximately right angles. Similarly, lateral and longitudinal conductors 63 and 64 also intersect on unit case 1. L-shaped solderless terminals 65 and 67 are inserted into the lateral and longitudinal conductors at prescribed intersections to form the desired circuit. External wire 66 is connected to this circuit through a solderless connection between conductor 63 and solderless connection blade 68 at the tip of solderless terminal 67 connected to the end of external wire 66.

This structure permits sharing of the insulative plate, but the plate must be assembled as a lateral/longitudinal frame and the wire guide cavities must be disposed throughout the frame. As a result, the structure becomes large and complex, increasing its cost and requiring a larger electrical connection box to enclose it. Also, in order to make the desired connections to the external circuit, solderless terminal 67, connected to external wire 66, is directly connected to the conductor. Thus, the external wire cannot be connected once the electrical connection box has been assembled.

It is the object of the present Invention to overcome the foregoing defects of the prior art. More specifically, it is intended to provide a solderless connection device for an internal circuit in an electrical connection box, while allowing the circuit to be formed easily and altered without major expense.

SUMMARY OF THE INVENTION

A circuit board assembly is provided which is particularly adapted for—although not limited to—enclosure in an electrical connection box for automotive use. There is a first plurality of lateral busbars substantially parallel to each other, as well as a second plurality of longitudinal busbars, also substantially parallel to each other. The two pluralities intersect each other, preferably at substantially right angles. A third plurality of slits is provided on the lateral busbars, and a fourth plurality of slits is on the longitudinal busbars. Each set of slits engages the other, at at least some points at which the lateral and longitudinal busbars intersect. Any portions of the busbars which are unnecessary to the circuits desired are cut away, thereby forming the conductive member. This member rests on one surface of a planar insulative plate. There is a fifth plurality of solderless terminals in electrical contact with predetermined positions on the conductive member.

It has been found preferable to have a pair of slits, one on each of the lateral and longitudinal busbars, at each of the intersections. It is further desirable to provide lattice grooves in the insulative plate so that at least a portion of the conductive member can be embedded therein. The insulative plate is. also desirably provided with one or more insertion grooves, each adapted to receive one of the solderless terminals. There is also at least one cutting groove into which a cutting tool may be inserted in order to cut away unneeded portions of the conductive member. These grooves usefully intersect the lattice grooves at substantially a 90° angle thereto.

The solderless terminals include both terminal plates and jumper terminals. Each of the former has a tab at one end and solderless connection blades at the other end. The jumper terminals are similar, but are provided with solderless connection blades at both ends. The insulative plate is capable of receiving the solderless terminals from either or both sides, thereby forming good electrical contacts.

It has been found especially useful to adjust the pitches of both the lateral and longitudinal busbars. In other words, the distances between adjacent busbars of each type are varied so as to correspond to the terminal opening pitches for the various electrical elements to which the busbars are to be connected. Also, it is advantageous to provide a power supply connection busbar stacked on the circuit board. The entire unit, of course, fits within an electrical connection box and is of relatively small size, considering the number and complexity of the circuitry provided.

The lateral and longitudinal busbars can be in the form of substantially identical-shaped flat horizontal or vertical strips having electrical continuity at their intersection points. The lattice-shaped conductive member formed thereby has sections not required for circuits cut away.

There is an insulative film covering each surface of the conductive material in order to prevent unwanted electrical contact. Terminal openings in the insulated film and optionally in the conductive member have terminal plates extending therethrough, so that one end of the terminal plate is in fixed electrical contact with the conductive member. The other end of the terminal plate is a tab adapted to act as the external connection terminal. It may also be a jumper terminal wherein solderless connection blades are at both ends and in contact with other layers of conductor members.

The bonding of the lateral and longitudinal busbars is not critical, but welding, fusing, or riveting have been found satisfactory. Similar, the terminal plates are connected to the conductive member (lateral and longitudinal busbars) by soldering, welding, riveting, or fusing.

Preferably, there is a plurality of conductive materials (with insulative film covering) stacked vertically. Adjacent conductive materials are electrically connected as is appropriate by way of terminal plates or jumper terminals. These connections can also be made by welding or fusing adjacent conductive members to each other through the terminal openings in the insulative films.

Here, too, the lateral and longitudinal busbars are each spaced apart from their adjacent busbars at prescribed and predetermined pitches. These pitches correspond to the terminal opening pitches for the various electrical elements to which the busbars are to be connected. The power supply connection busbar, as in the previous cases, is usefully stacked on one of the insulated films.

A desirable form of the Invention essentially substitutes wires for at least some of the busbars previously described. First and second pluralities of lateral and longitudinal wires are provided. The lateral wires are substantially parallel to each other as are the longitudinal wires. The first plurality is layered on the second plurality so that they meet each other at intersection points, thereby forming the conductive member. The member is fixed on a generally planar insulative plate and the sections of the material which are unnecessary for the circuits are cut away. The usual solderless terminals are fixed to the lateral wires and the longitudinal wires at positions predetermined by the desired circuitry. The conductive member may be covered on both sides by insulative film.

Terminal plates, with a tab at one end and connection blades at the other end, and jumper terminals, having connection blades at both ends, are used to interconnect two or more layers of conductive material with each other; they also make contact with external circuits. The terminals can be inserted from either or both sides of the insulative plate.

As in the other configurations, it is particularly desirable if the pitches of the lateral and longitudinal wires are such that they correspond to the terminal opening pitches for the various electrical elements to which connection is to be made. Also, the power supply connection busbar can be stacked on the circuit board.

BRIEF DESCRIPTION OF THE DRAWINGS

In the accompanying drawings, constituting a part hereof, and in which like reference characters indicate like parts.

FIGS. 12(A), 12(B), 12(C) and 12(D) are schematic representations of a prior art device;

DETAILED DESCRIPTION OF THE INVENTION

Figure 1:
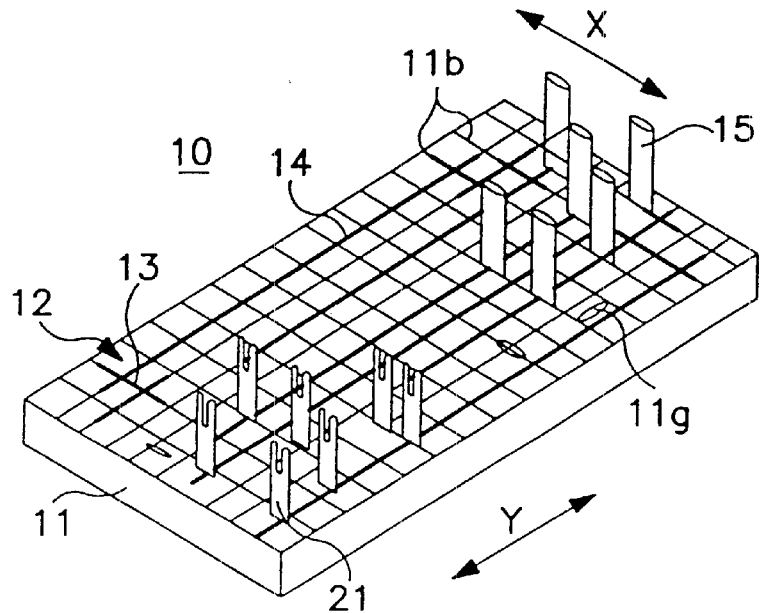
FIG. 1 is a perspective view of the inventive circuit board.
Figure 2A:
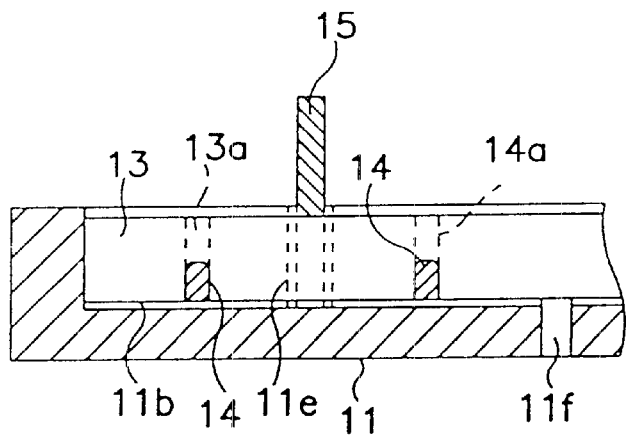
FIG. 2(A) is an enlarged cross section of a portion of the circuit board of FIG. 1.
Figure 2B:
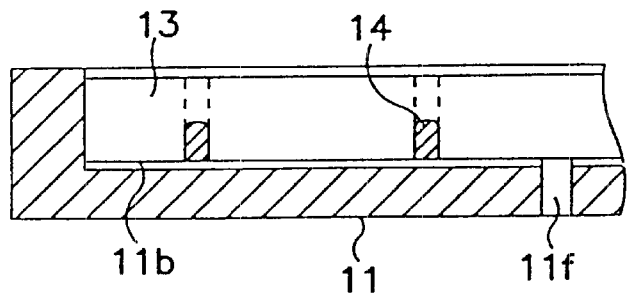
FIG. 2(B) is a further enlarged cross section of the circuit board of FIG. 1.

Referring in particular to FIGS. 1 and 2, circuit board 10 comprises insulative plate 11, conductive member 12 embedded in lattice grooves 11$b$, lateral busbars 13 and longitudinal busbars 14. Terminal plates 15 and jumper terminals 21 make contact with conductive member 12 as is required by the demands of the particular circuits involved. Lateral busbars 13 extend in the X direction and longitudinal busbars 14 extend in the Y direction. Terminal groove 11$e$ permits insertion of the solderless terminals from above, openings 11$f$ permit insertion of the terminals from below, and holes 11$g$ permit insertion of the solderless terminals from either direction. Slits 13$a$ in lateral busbars 13 and slits 14$a$ in longitudinal busbars 14 are inserted into one another in order to form the desired conductive member (see FIGS. 4 and 5).

Figure 3:
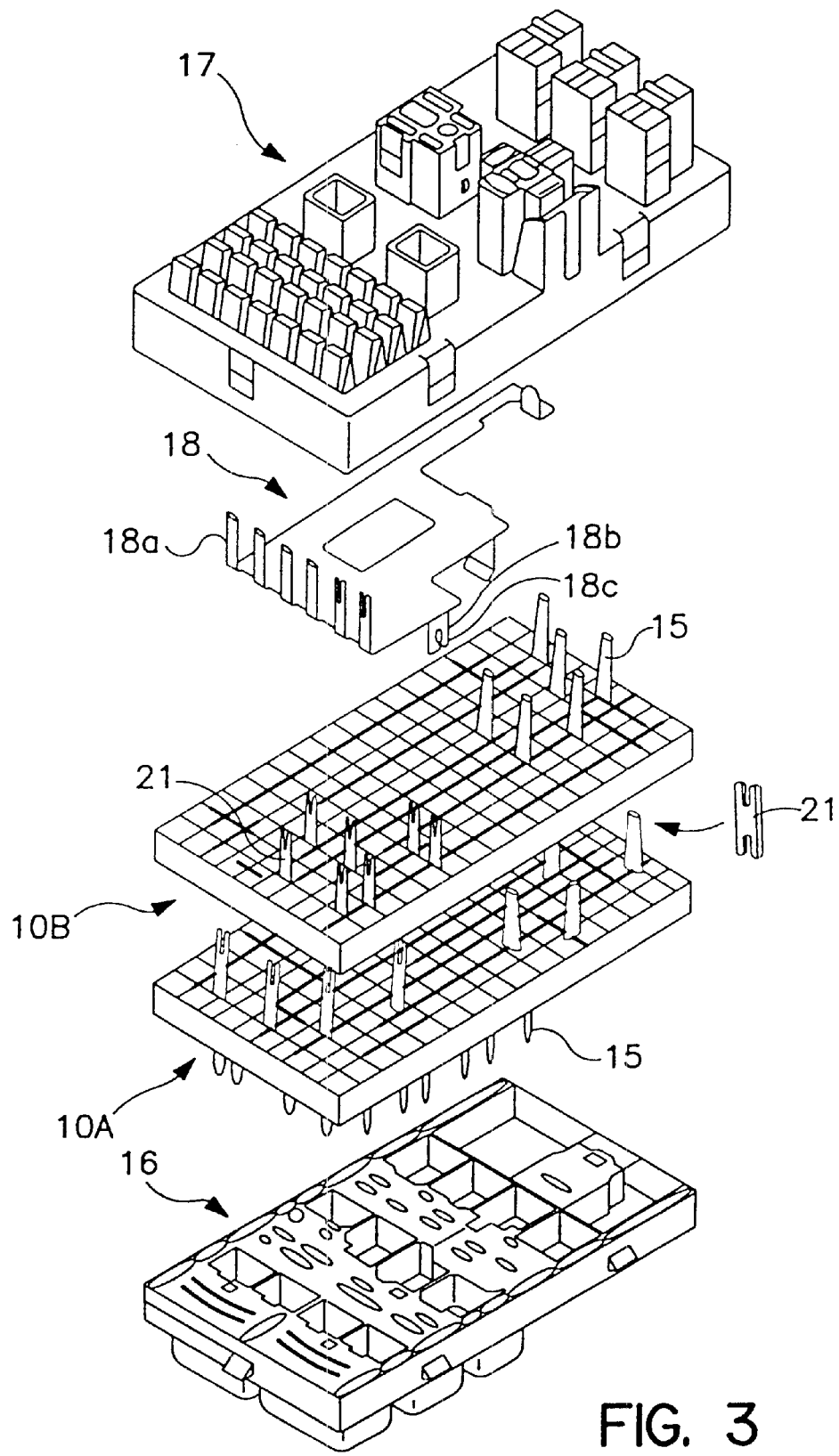
FIG. 3 is an exploded perspective view of the electrical connection box.

The present Invention contemplates that a plurality of circuit boards, each produced in accordance with the present Invention, would be stacked and enclosed in an electrical connection box. In FIG. 3, for example, circuit boards 10A and 10B are stacked vertically and held in lower case 16. Since the lattice grooves are completely within the insulative plate, there is no difficulty with vertical stacking and the total height is the same as if the two insulative plates alone were stacked together.

When stacking the boards, terminal plates 15 and jumper terminals 21 are inserted through the corresponding openings in circuit boards 10A and 10B to project from the opposite surfaces thereof. Thus, jumper terminals 21 provide a solderless connection with upper busbars 13 and 14, thereby electrically connecting the busbars with circuit boards 10A and 10B. In similar fashion, solderless terminals 15 project downward from upper circuit board 10B and are passed through corresponding holes in lower circuit board 10A and project downward. These terminals enter the terminal openings disposed on lower case 16. Power supply connection busbar 18 is located above circuit board 10B, separated by an insulating space. Busbar 18 is bent upward to form tabs 18$a$ to connect with an external terminal (not shown) which, in turn, is connected to the power supply. Solderless connection blade 18$b$ is formed at the end of solderless plate 18$c$ which has been bent downward; thereby a solderless connection is formed with busbars 13 and 14 of circuit board 10B.

Upper case 17 is placed over the various busbars and boards and terminal plates 15 which project from the upper surface of circuit board 10B passed through terminal openings in the various electrical elements such as connectors, relays, and fuse holders. Since the presence of terminal plates 15 provides positional ti support, busbars 13 and 14 are firmly supported and retained on insulative plate 11. Upper case 17 and lower case 16 are locked together to complete the assembly of the electrical connection box.

Circuit board 10 is produced in the manner best shown in FIGS. 4 through 10. Lateral and longitudinal busbars 13 and 14 are formed by cutting strips of conductive metal plates of substantially uniform width into predetermined lengths. Slits 13$a$ and 14$a$ are formed at the intersection points of busbars 13 and 14. The busbars are disposed parallel to each other as is particularly shown in FIGS. 4 and 5.

Figure 6:
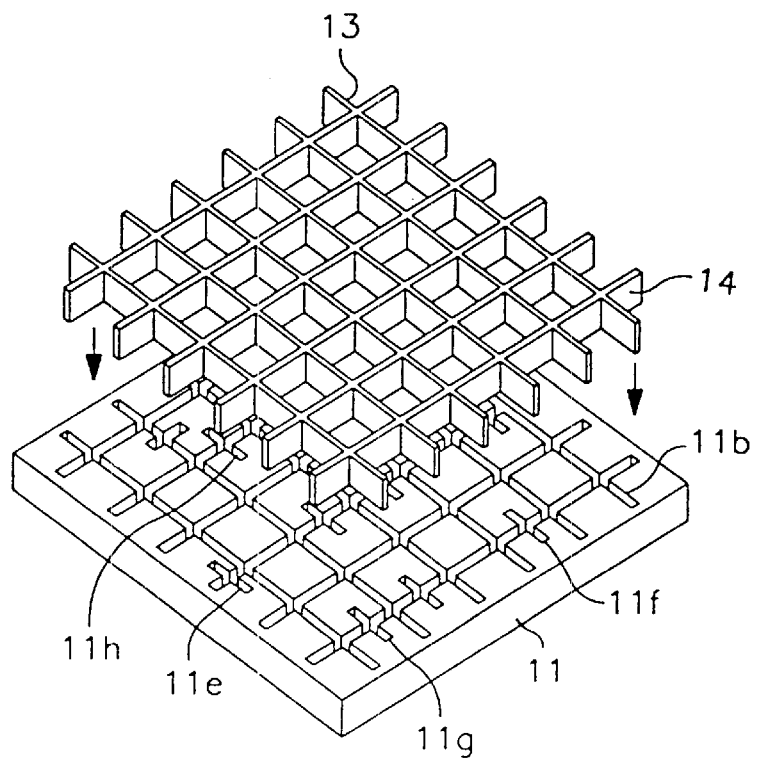
FIG. 6 shows the conductive member being inserted into the insulated plate.

Slits 13$a$ and 14$a$ have widths which are the same as—or slightly smaller than—the thickness of busbars 13 and 14. On assembly, they are pressed into one another to provide a firm connection. The depth of slits 13$a$ and 14$a$ are preferably half the height of busbars 13 and 14 so that the ends of busbars 13 and 14 are coplanar. As best shown in FIG. 6, lattice grooves 11$b$ are formed in insulative plate 11 to correspond to the conductive member which is comprised of lateral busbars 13 and longitudinal busbars 14. Lattice grooves 11$b$ have depths which are equal to—or slightly greater than—the height of the busbars, so that the upper ends thereof do not project from lattice grooves 11$b$. However, while this is to be preferred for many applications, the present Invention is not so limited.

Figure 11A:
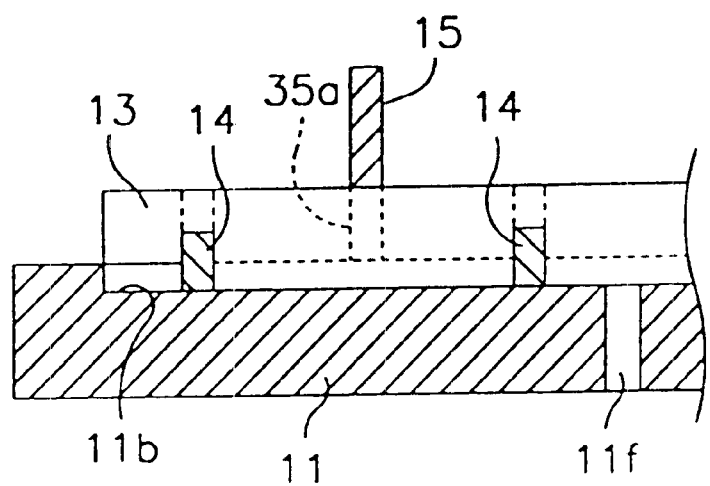
FIGS. 11(A) and 11(B) are enlarged schematic cross sections showing the present Invention.

If there is no objection to the busbars projecting out of insulated plate 11 (it may even be desirable to do so in some circumstances), slits 13$a$ and 14$a$ can be substantially less than the height of the busbars. An example of this is found in FIG. 11(A), lattice grooves 11$b$ on insulative plate 11 have a smaller groove depth than the height of busbars 13 and 14. Therefore, only the lower portions thereof are held and supported and the upper portions project from the surface of insulative plate 11. Solderless terminals 15 have solderless blades having blade depth 35a equal to the height by which the busbars project from the upper surface of the insulative plate. Since terminal plates 15 are connected to the busbars, there is no need for corresponding grooves. When the boards are stacked and inserted into the electrical connection box, the upper ends of busbars 13 and 14 contact the lower surface of the insulative plate immediately above; therefore, the boards can be stacked without difficulty. Thereafter, the upper and lower cases of the connection box are then locked together as previously explained.

Figure 11B:
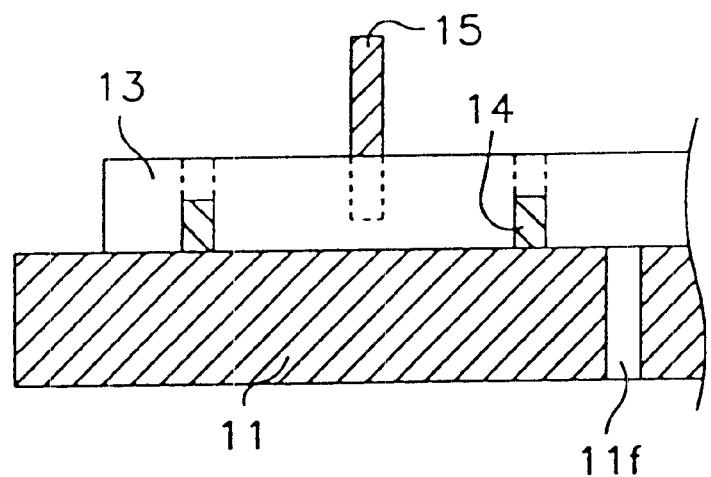
Figure 13:
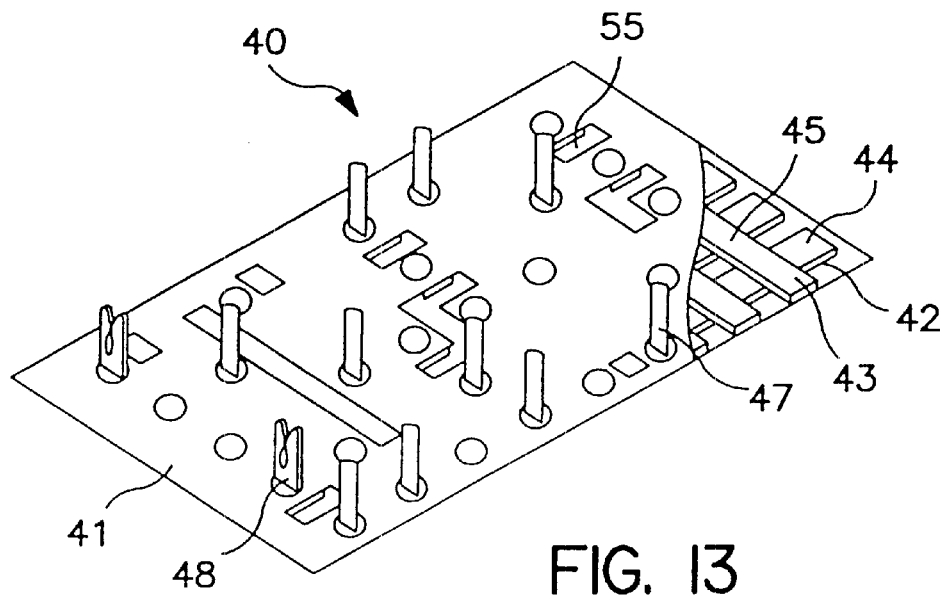
FIG. 13 is a perspective view, similar to that of FIG. 1.

In FIG. 11(B), busbars 13 and 14 are disposed on the upper surface of insulative plate 11, without any lattice grooves. Similarly, grooves for the various solderless terminals are also not formed. Since busbars 13 and 14 are resting on the surface of insulative plate 11, a cutting tool can be used to cut away unwanted sections of the circuit, without the necessity of any insertion grooves therefor. The solderless terminals are connected to the busbars from above and the conductive materials are inserted into the connector holders which are on the upper and lower cases of the electrical connection box. This fixes them in their prescribed position on the insulative plate. The box is then locked in the usual manner.

The width of lattice grooves 11b is preferably somewhat wider than the thickness of the busbars; this allows the busbars to be easily inserted into the grooves. However, if the width of the grooves is equal to or narrower than the width of the busbars, a more secure grip is provided and the lattice of the conductive member is more securely maintained. Therefore, it is useful to provide that at least some of the lattice grooves are narrower for this purpose. Most preferably, lattice grooves 11b located at the outer perimeter have the narrower widths.

Figure 4:
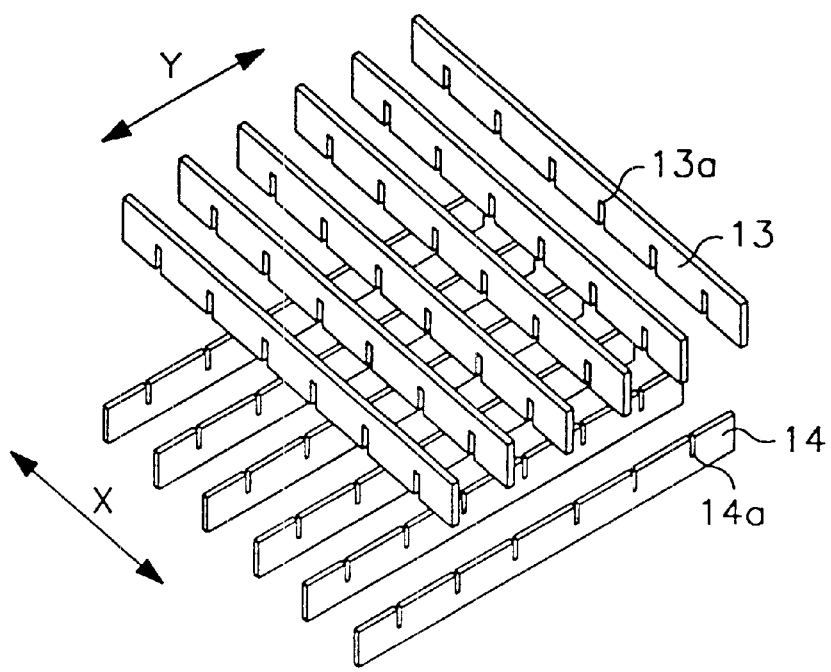
FIG. 4 is a perspective view of the lateral and longitudinal vertical busbars prior to connection.
Figure 5:
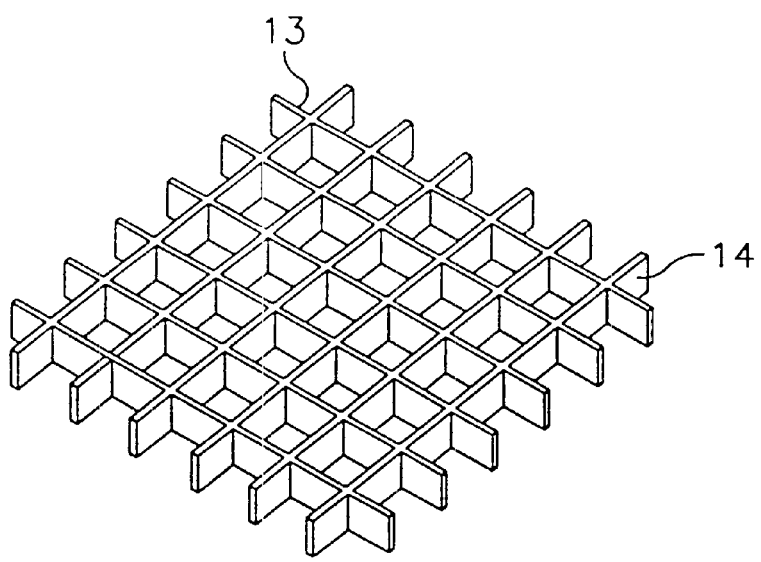
FIG. 5 is a perspective view wherein the conductive material has been formed into the lattice-shaped conductive member.

Although the distances between adjacent parallel busbars are shown as being equal in FIGS. 4 and 5, this need not be so. As shown, for example, in FIG. 10, pitches P1 through P5 can vary. The spacing is determined so that it corresponds to the pitches for relay terminals, fuse terminals, connector terminal holes, etc. The connections which are to be made to various electrical elements will determine the optimum spacing. Slits 13a and 14a also match pitches P1 to P5.

Terminal grooves 11e in insulative plate 11 receive solderless terminals from above, openings 11f receive solderless terminals from below, and holes 11g are adapted to receive solderless terminals from layers either above or below. Of grooves 11e, openings 11f, and holes 11g intersect lattice grooves 11b perpendicularly, this provides the best position for the solderless connection blades to engage the wires or portions of the conductive member to which they are to be connected.

Figure 7:
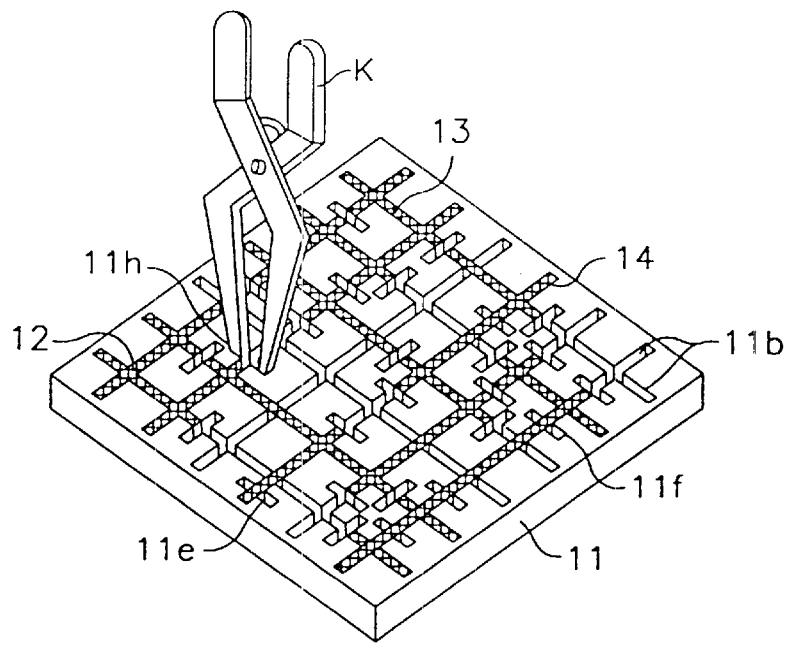
FIG. 7 shows the unneeded portions of the conductive member being cut away.
Figure 8:
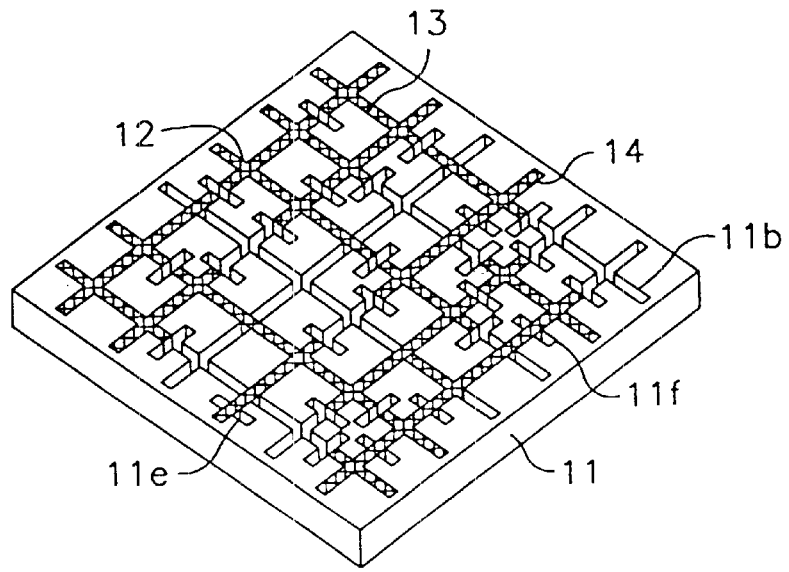
FIG. 8 is a perspective view of the method of making the inventive circuit board.

Insertion grooves 11h are also provided in insulative plate 11, as best shown in FIG. 7. Cutting grooves 11h are designed to receive tool K which severs the portions of conductive member 12 which are unnecessary to complete the desired circuits, thus permitting removal thereof. FIG. 8 shows the circuit board after removal of the redundant portions of conductive member 12. Alternatively, the unnecessary portions can be removed before the conductive member is inserted into insulative plate 11. In such a case, insertion grooves 11h can be eliminated.

Figure 9:
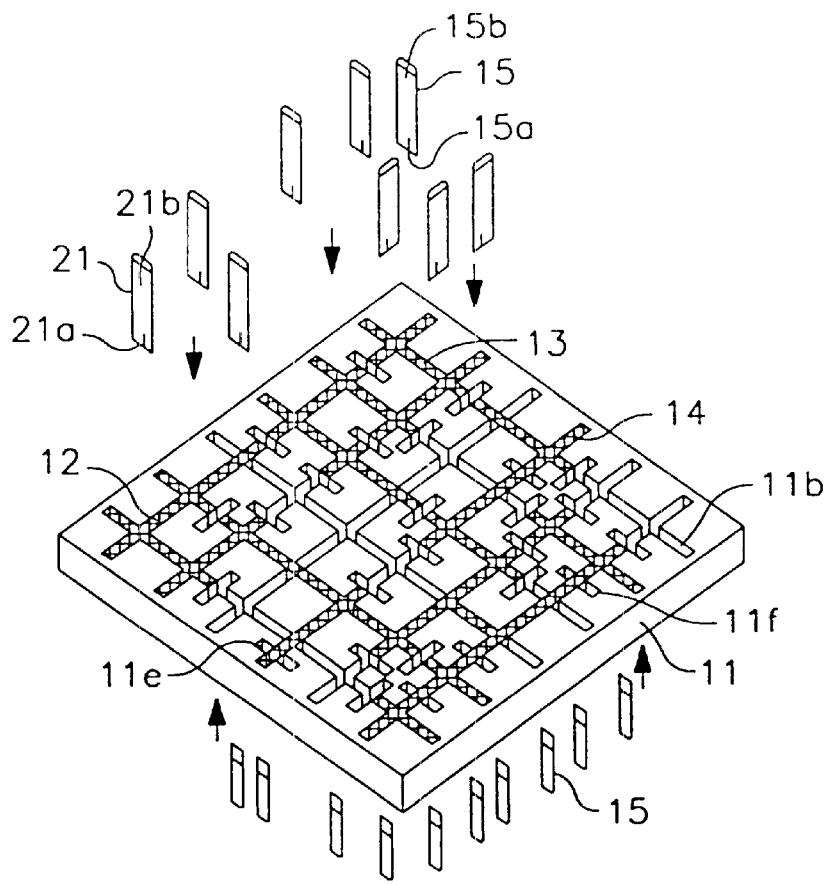
FIG. 9 is a view, similar to that of FIG. 8, showing the insertion of the various solderless terminals.
Figure 10:
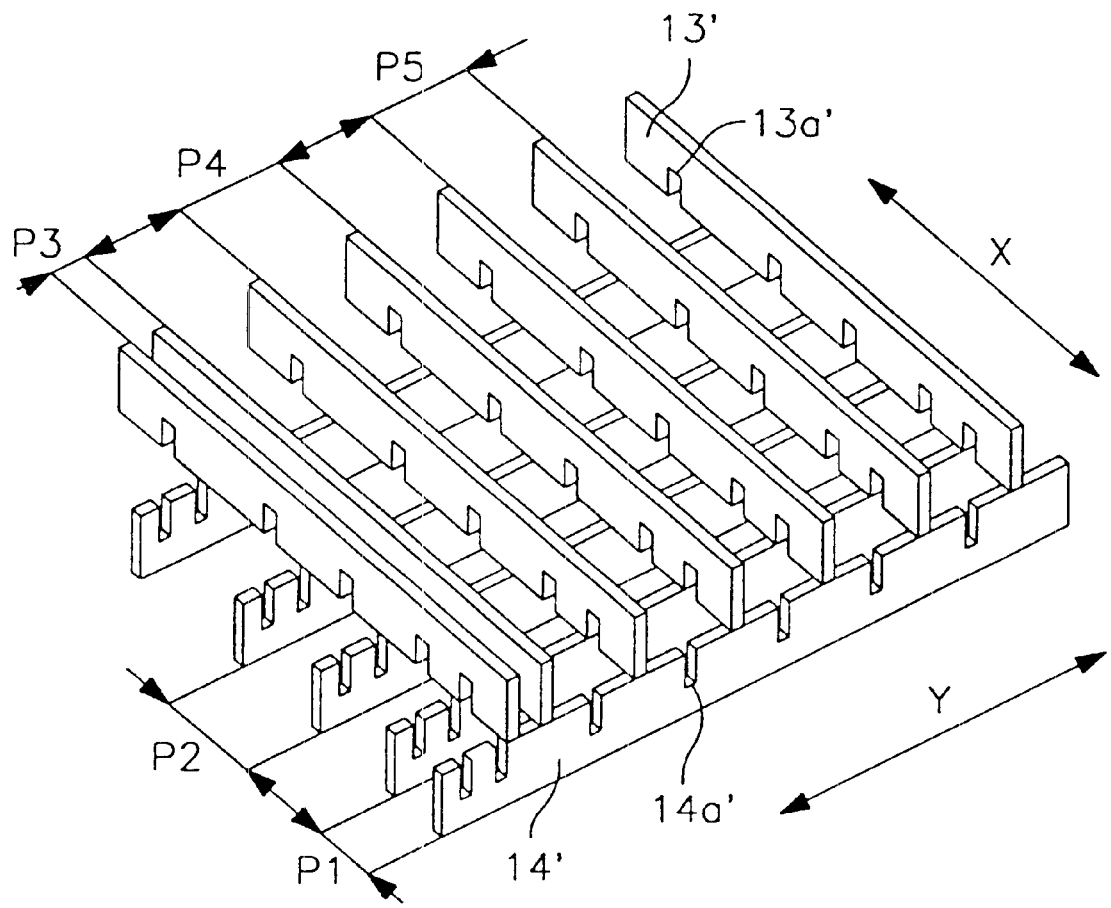
FIG. 10 indicates the method of producing the conductive member of the present Invention having varied pitches.

In FIG. 9, terminal plates 15 are introduced into terminal grooves 11e to form a solderless connection with busbars 13 and 14. These terminal plates have solderless connection blades 15a at one end and tabs 15b at the other end. The former connects with conductors 12 and the latter is a male terminal to connect with an external circuit.

If terminal plate 15 is to be inserted from above insulative plate 11, terminal groove 11e is used and the terminal plate projects upward. Alternatively, if terminal plate 15 is inserted from below, it is introduced into opening 11f and projects downward. Circuit board 10 is also provided with jumper terminals 21 which have connection blades 21a and 21b at either end; one end is inserted into terminal groove 11e or hole 11f, depending upon the direction from which it enters. This facilitates changes and modification in the number and positions of the connections to the various circuits.

As shown in FIGS. 13, 14(A), 14(B), and 16, circuit board 40 includes conductive member 42 and insulative film 41. The conductive member is formed as a lattice from horizontal lateral busbars 43 and horizontal longitudinal busbars 44, and is comprised of substantially identically shaped flat strips located parallel to each other and layered (see particularly FIGS. 16 and 17). Intersections 45 of busbars 43 and 44 are welded or otherwise electrically connected. The sections of conductive member 42 which are unnecessary for the circuits desired are cut away. Terminal grooves 46 are formed in conductive member 42 and terminal plates 47 and jumper plates 48 are inserted therethrough to form a solderless connection. If intersections 45 are to be welded, welding openings 53 are provided to facilitate this operation.

Vertically stacked circuit boards 49 and 50 (see FIG. 15) contain upper conductors 51 and lower conductors 52. They are welded together at welding points 20 via welding openings 53 which are formed on the appropriate portions of insulative films 41. The circuit boards are stacked and stored, along with power supply busbar 18 in an electrical connection box formed by locking together lower case 16 and upper case 17.

Figure 16:
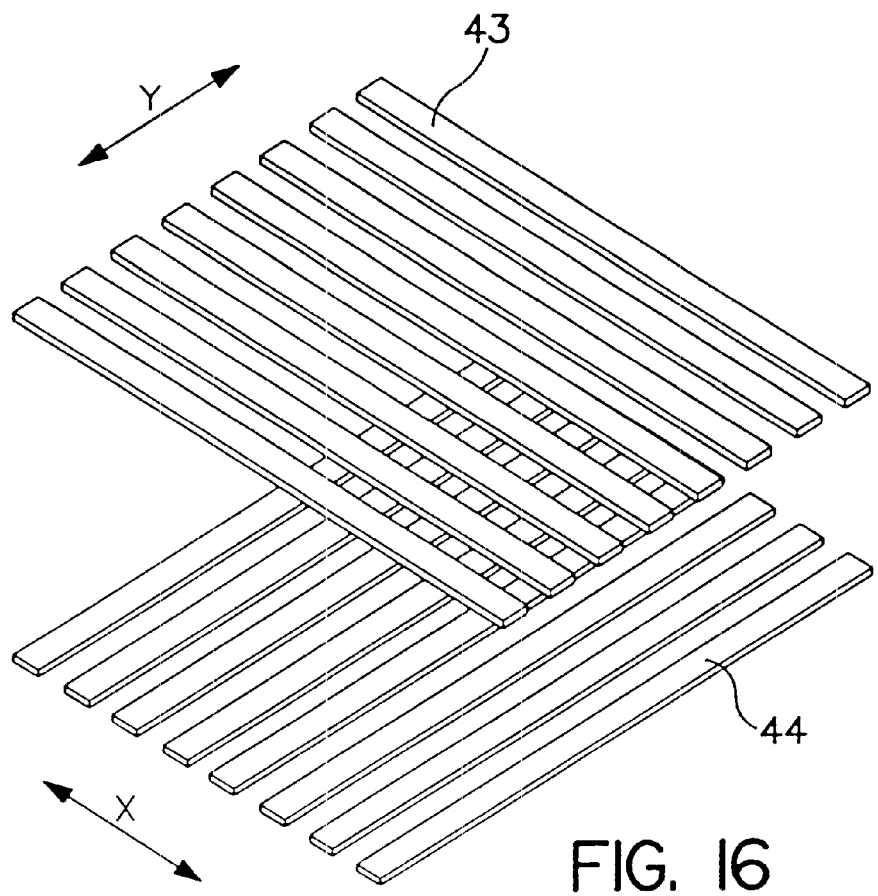
FIG. 16 is a view similar to that of FIG. 4.

The circuit board is produced as best shown in FIGS. 16 through 22. Lateral busbars 43 and longitudinal busbars 44 are produced from substantially identically-shaped flat strips of conductive metal plates having uniform width and fixed lengths. As shown in FIG. 16, lateral busbars 43 extend along the X axis and longitudinal busbars 44 extend along the Y axis. Each set is parallel to each other and the busbars are flat, rather than vertically oriented.

Figure 20:
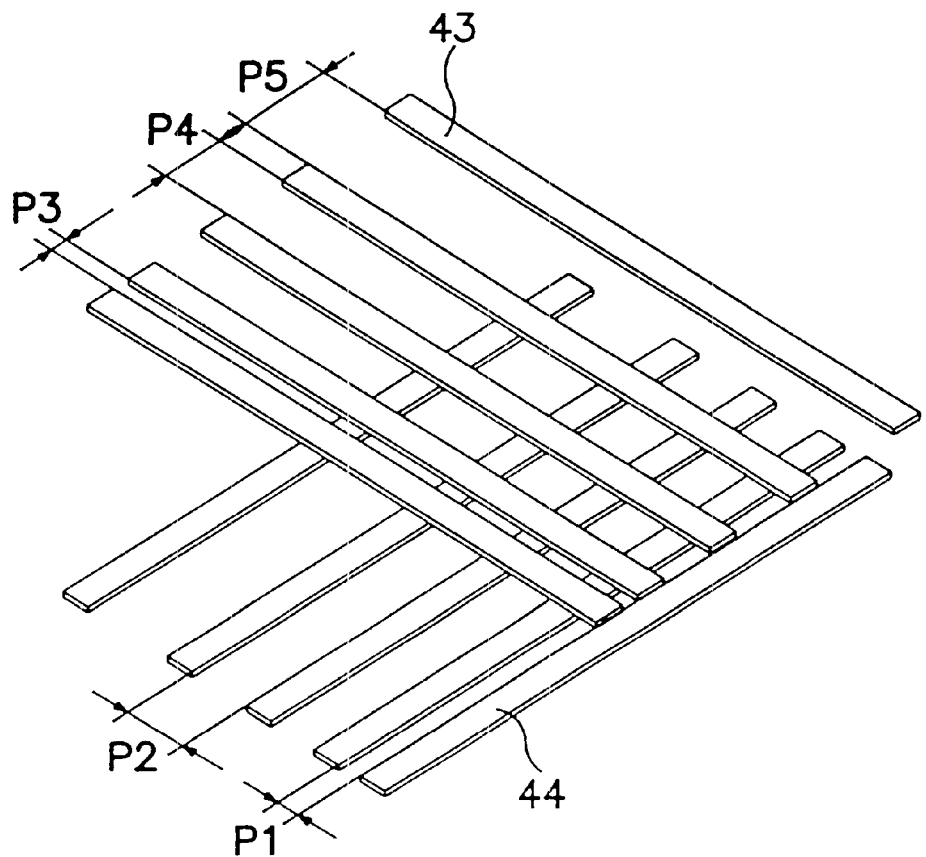
FIG. 20 is a view, similar to that of FIG. 10, using horizontal busbars.

If it is desired to arrange either or both of the lateral and longitudinal busbars 43 and 44 at different pitches, the arrangement is shown in FIG. 20. Pitches P1 through P5 vary depending upon the corresponding pitch of the electrical elements with which these busbars are to be connected.

Figure 17:
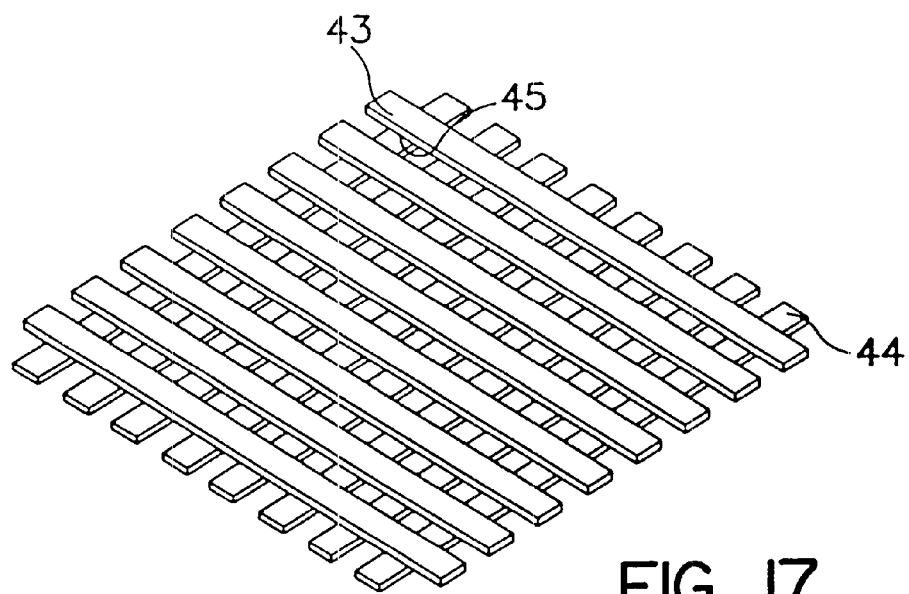
FIG. 17 is a view of the lattice shaped conductive member composed of horizontal busbars.

FIG. 17 shows the completed conductors arranged in the lattice configuration. It has been found desirable to weld the busbars together at intersection points 45, thereby to provide reliable electrical contact and physical stability. The busbars can be bonded by other means such as rivets, bolts, fusing, etc.

Figure 18:
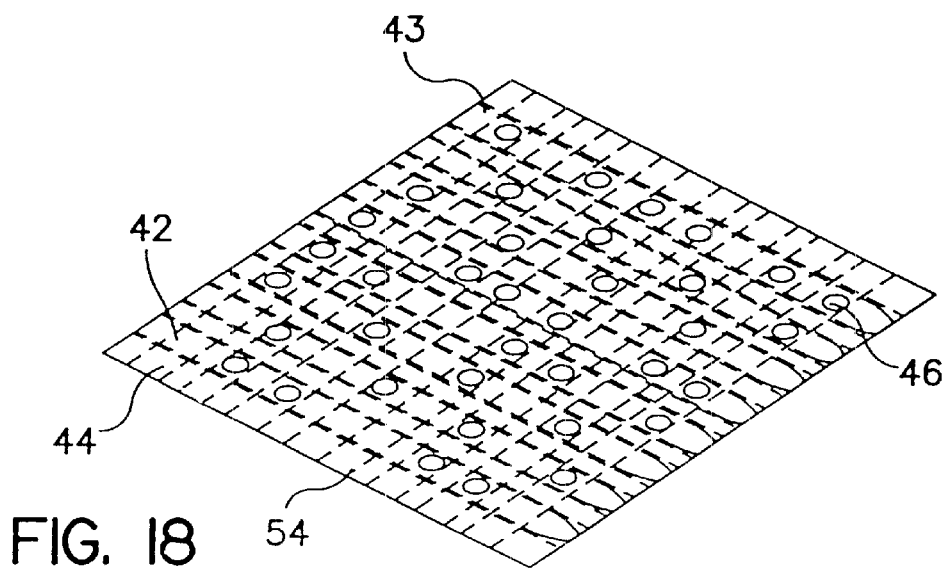
FIG. 18 is a view similar to that of FIG. 6.
Figure 19:
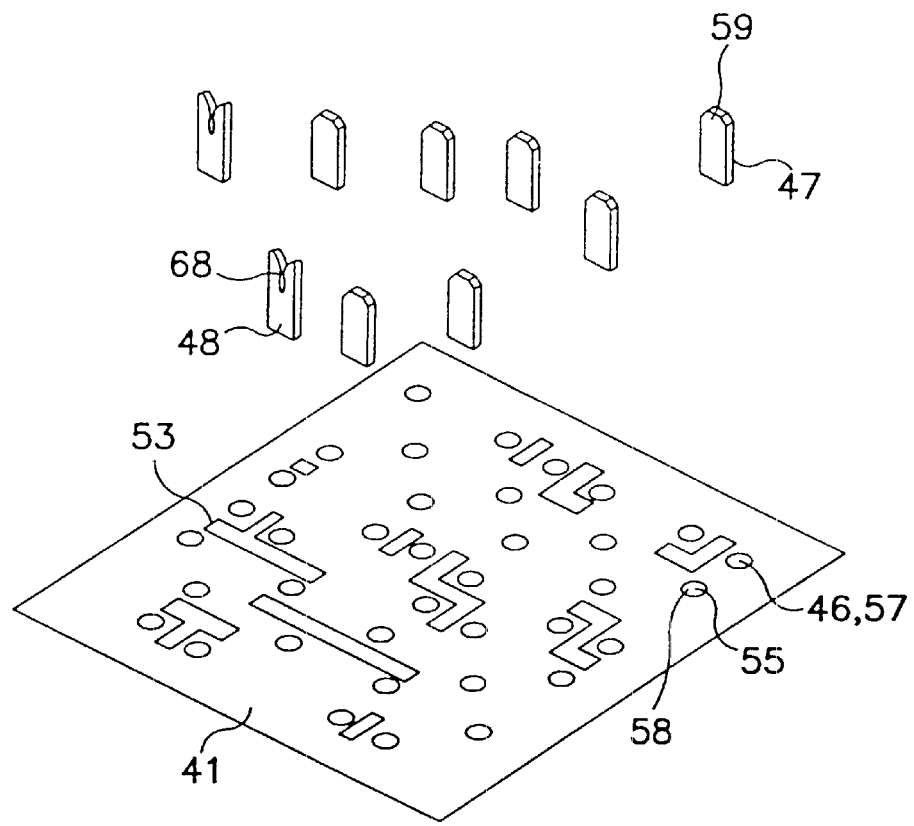
FIG. 19 is a view, similar to that of FIG. 18, showing the insertion of the terminal plates and jumper terminals into the insulative plate.

As shown in FIGS. 18 and 19, lateral busbars 43 and longitudinal busbars 44 are arranged as a lattice to form conductive member 42. Insulative films 54 are located on both surfaces thereof. Terminal grooves 46 are provided for introduction of terminal plates 47. When terminal openings 55 in conductive member 42 are formed, insulative film 54 will be stamped at the same time.

As to the portions of conductive member 42 which are unnecessary for the circuits required, they will be cut away along with those parts of insulative film 54 which cover them. This can be carried out by pressing, punching, or the like and results in the desired circuit. Alternatively, the unneeded sections can be cut away before insulative films 54 have been applied.

Terminal grooves 46 may be stamped in conductive member 42 by any known means and are used also as connection positions for terminal plates 47 which are, in turn, connected to the external circuits. Terminal openings 55 for the solderless terminals are also stamped on conductive member 42 at the same time, resulting in film openings 58 on the insulative films at positions corresponding to the terminal openings. If the sections are to be cut away from conductive member 42 by stamping, only film openings 58 are formed on insulative film 54. It is preferred that the dimensions of terminal grooves 46 be no larger than the cross sectional area of the inserted section of the solderless terminals inserted therein, thereby providing a medium or tight fit.

Once the foregoing has been accomplished, terminal plates 47 and jumper terminals 48 are inserted into terminal openings 55 and the inserted section of terminal plates 47 and conductive member 42 is soldered on one or both sides. After the terminal plates have been inserted, it is desirable that the ends of the terminal plates project from the back of the conductive material and are soldered in place. Alternatively, the terminal plate can be inserted so that one end projects from the opposite side. In such a case, the projected portion can be bent over and flattened and, if the fit is sufficiently firm, soldering or the like may be omitted.

Figure 21:
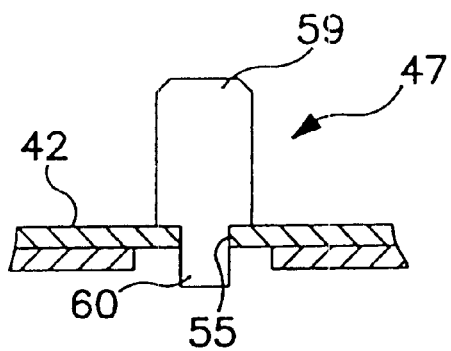
FIG. 21 is an enlarged cross section showing a terminal plate fitted into the conductive member.

Terminal plates 47 include tab 59 on one end which can serve as a male terminal for connection with external circuits. The terminal plate can be inserted from either side of conductive member 42 and projects from the side into which it was inserted. As shown in FIG. 21, insertion end 60 of terminal plate 47 is designed with cuts at both sides so that the depth of insertion into conductive member 42 is restricted and defined. Jumper terminal 48 (see FIG. 19) has solderless connection blade 68 at one end and serves as a connector for the internal circuit. Jumper terminals 48 are inserted into terminal openings 55 to be connected and fixed to conductive member 42, whereby the circuit board is formed. The insertion ends of jumper terminals 48 can also be formed as shown in FIG. 21.

Figure 14A:
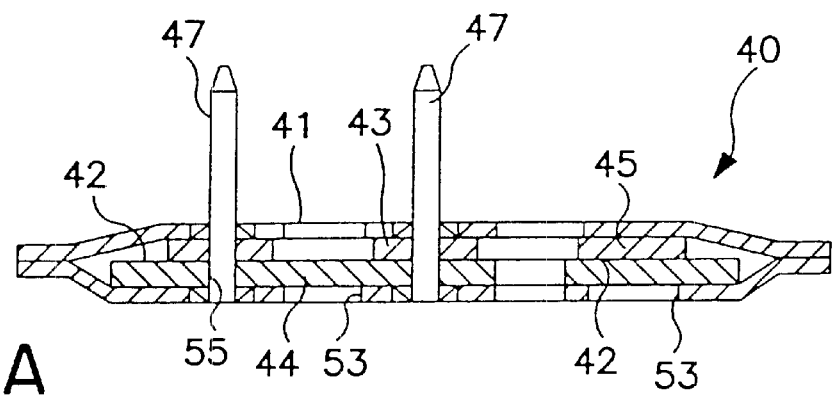
FIG. 14(A) is a cross section of a single circuit board according to FIG. 13.
Figure 14B:
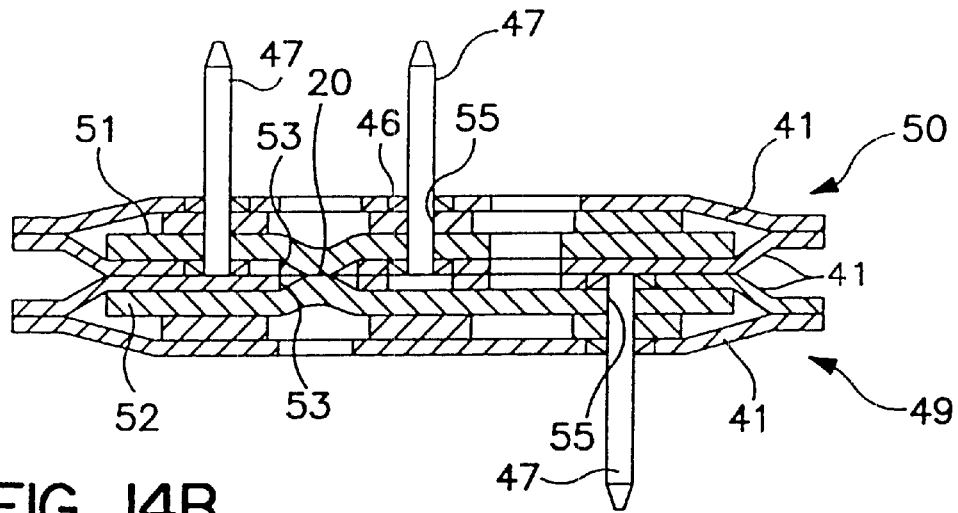
FIG. 14(B) is a cross section, similar to that of FIG. 14(A), showing stacked circuit boards.
Figure 15:
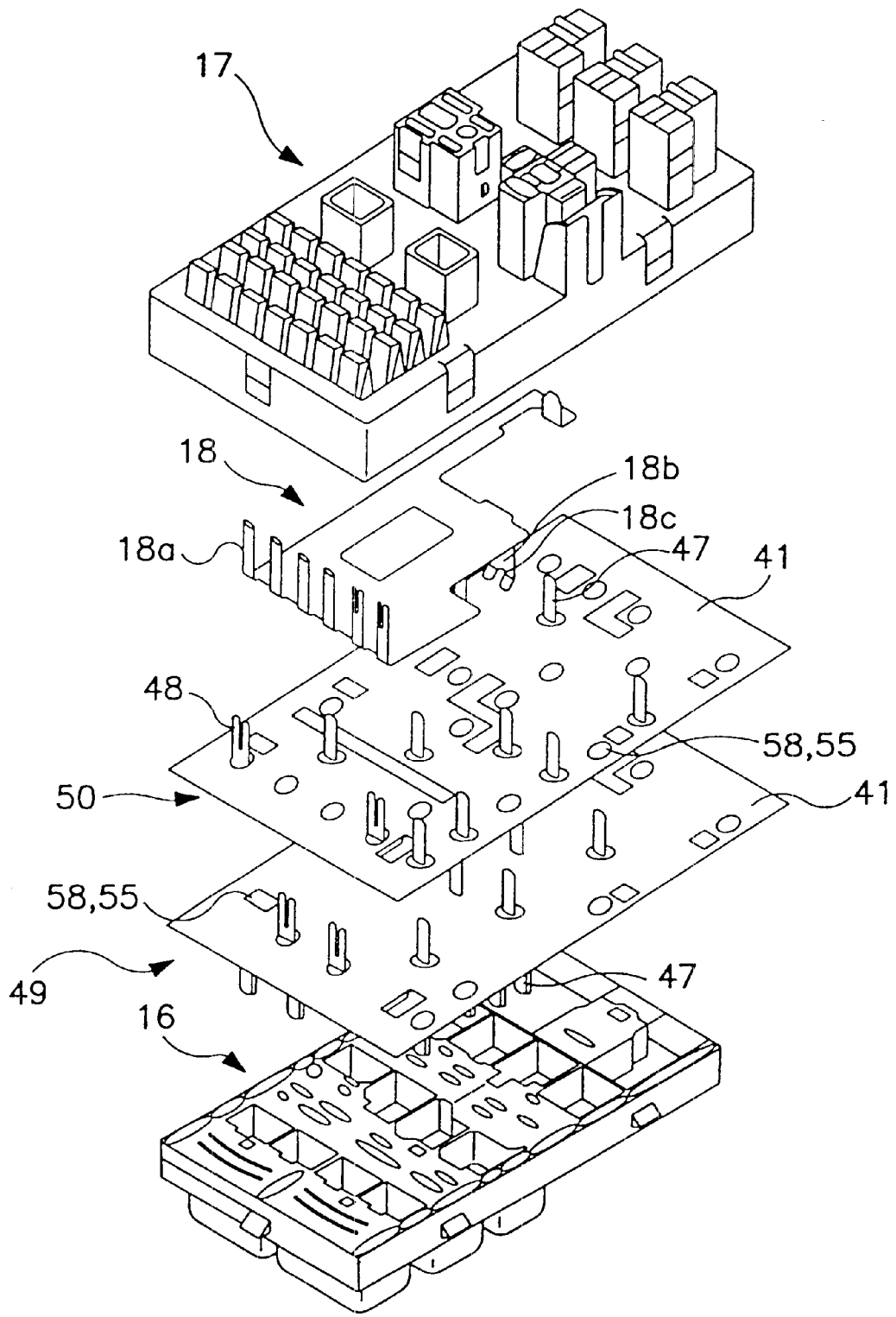
FIG. 15 is a view similar to that of FIG. 3.

Referring now to FIGS. 14A, 14B, and 15, circuit boards 49 and 50 are stacked vertically and retained in lower case 16. The conductors are covered by the insulative films so that direct stacking is entirely feasible. Conductors 51 and 52 of the vertically adjacent layers are placed in contact by using a clamp or the like to apply pressure from above and below at welding openings 53 in insulative film 41. Welding points 20 bond the upper and lower conductors 51 and 52, thus providing reliable continuity and stability. Resistance welding has been found most suitable, although the bonding can be performed in any recognized manner such as fusing, rivets, bolts, etc.

From FIGS. 14(A), 14(B), and 15, it can be seen that terminal plates 47 of lower circuit board 49 pass through film openings 58 and terminal openings 55 of stacked circuit board 50 and project upward. Jumper terminals 48 pass through film openings 58 and terminal openings 55 of upper circuit board 50 and form a solderless connection between lower conductive member 52 and upper conductive member 51. Terminal plates 47 on upper stacked circuit board 50 pass through film openings 58 and terminal openings 55 and project downward into corresponding openings formed in lower case 16.

In FIG. 15, power supply busbar 18 is located above circuit board 50 and separated by an insulating space. Tabs 18a, formed by an upward bend of busbar 18, connect with an external terminal (not shown) which is connected to the power supply. Busbar 18 also includes solderless plate 18c which is bent downward and carries solderless blade 18b at its end. This forms a solderless connection with conductive member 42 of circuit board 50.

The circuit boards and power supply busbar are stacked over lower case 16 and covered by upper case 17. The various terminal plates and projections are inserted into their appropriate terminals and upper case 17 is locked onto lower case 16, thereby completing the assembly of the electrical connection box.

Figure 22:
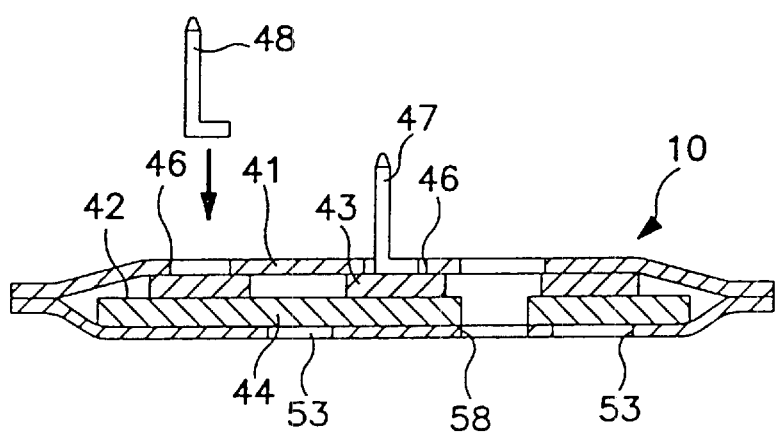
FIG. 22 is a cross section showing the insertion of a solderless terminal.
Figure 23A:
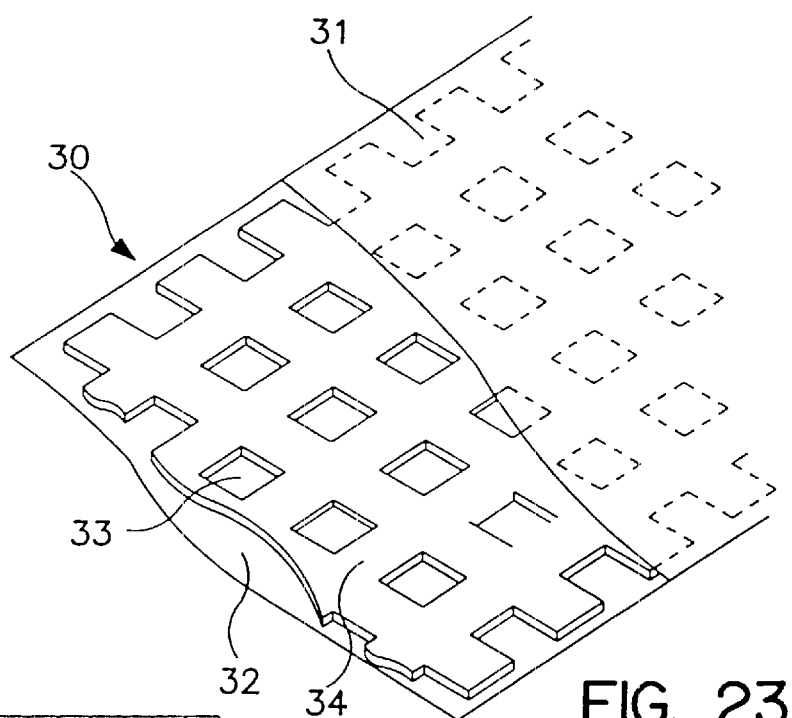
FIGS. 23(A) and 23(B) are views of a prior art device.
Figure 23B:
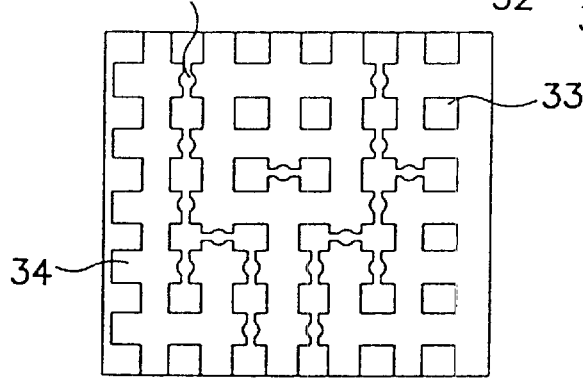

In FIG. 22, terminal plates 47 are formed with L-shaped bends which pass through terminal grooves 46. No openings are formed on conductive member 42, and the terminal plates are welded or otherwise affixed thereto. One leg of terminal plate 47 is welded to the conductive material; this provides a substantial area of contact and allows easy and reliable welding. Spot welding is preferred, but fusing, rivets, bolts, etc. are all suitable.

Figure 24:
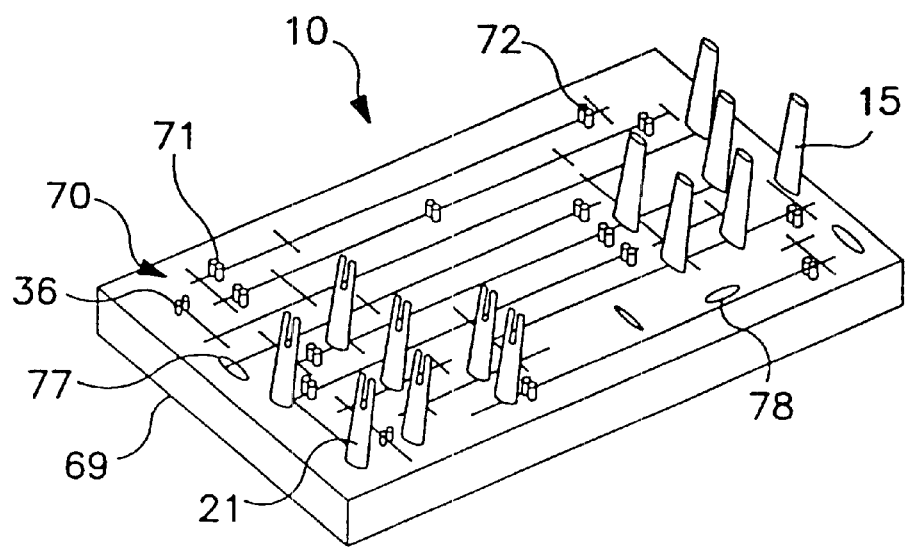
FIG. 24 is a perspective view, similar to that of FIG. 1.
Figure 25A:
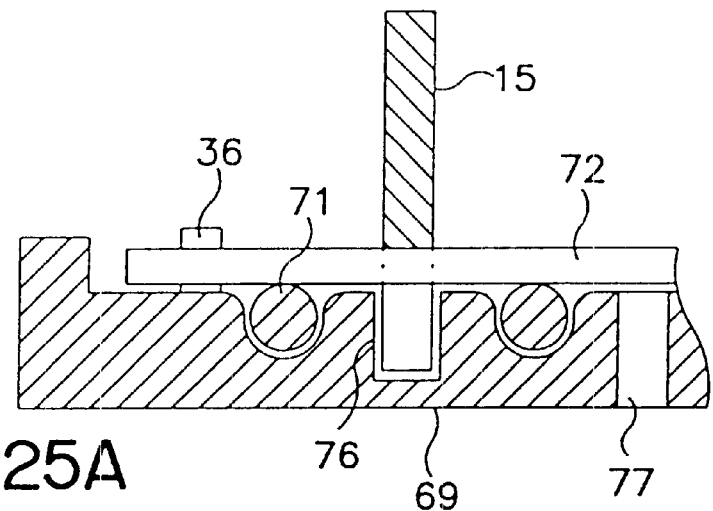
FIGS. 25(A) and 25(B) are enlarged schematic cross sections of the circuit board of FIG. 24.
Figure 25B:
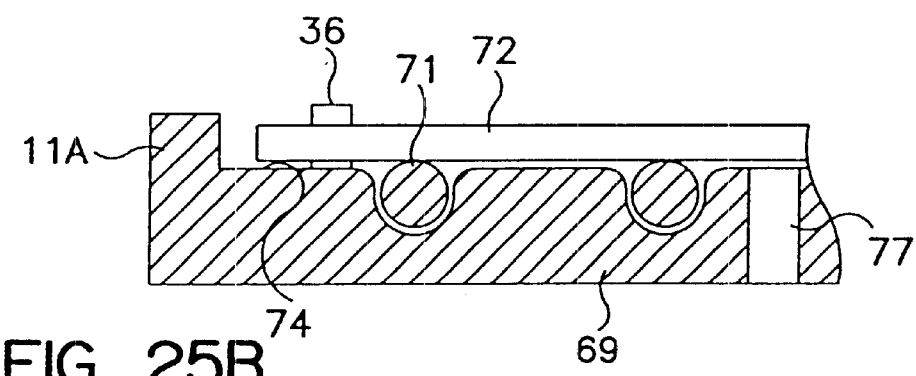

In FIGS. 24, 25(A), and 25(B), circuit board 10 is shown in a manner similar to FIGS. 1, 2(A), 2(B), 13, 14(A), and 14(B). The busbars are replaced by wire member 70 formed by longitudinal wires 71 and lateral wires 72. The wires preferably have solid cores and the lateral wires are parallel to each other, as are the longitudinal wires. They are layered over each other and the intersection points are connected by welding or other known means. Sections of the wires which are not needed for formation of the desired circuits are cut away and solderless terminals 15 are fixed to wires 71 and 72 at prescribed positions to form solderless connections.

Figure 26:
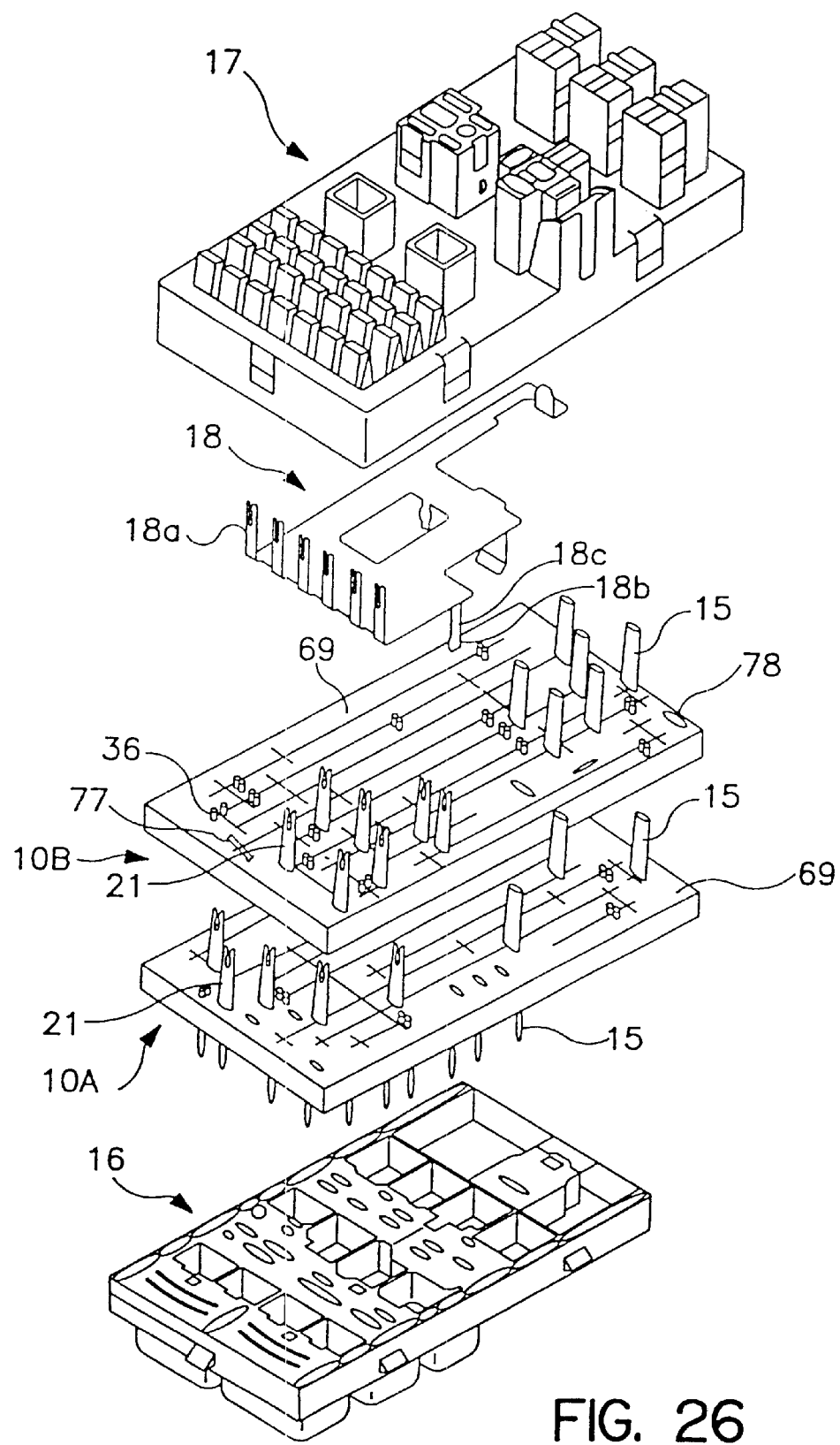
FIG. 26 is an exploded perspective view similar to that of FIG. 3.
Figure 27:
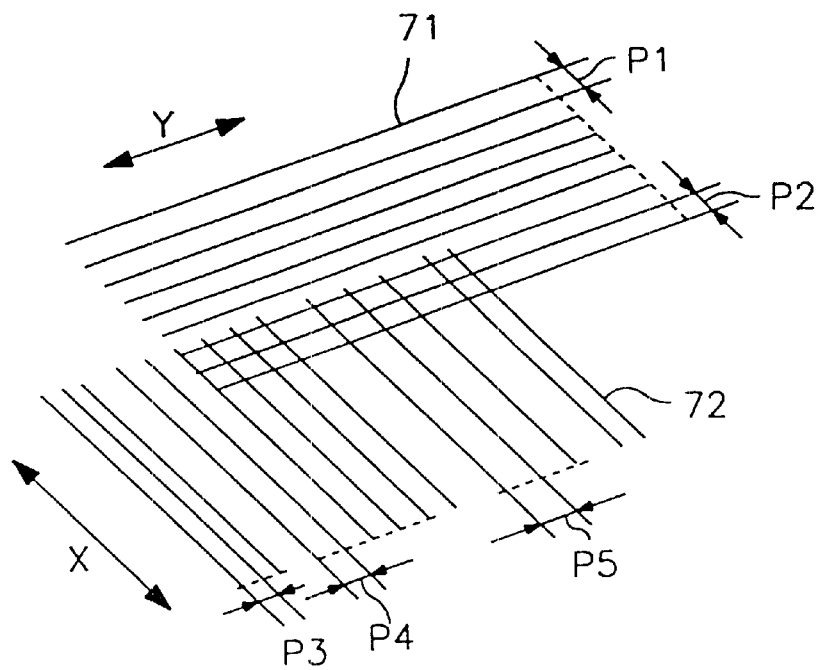
FIG. 27 is a schematic perspective view of the conductive member.
Figure 28:
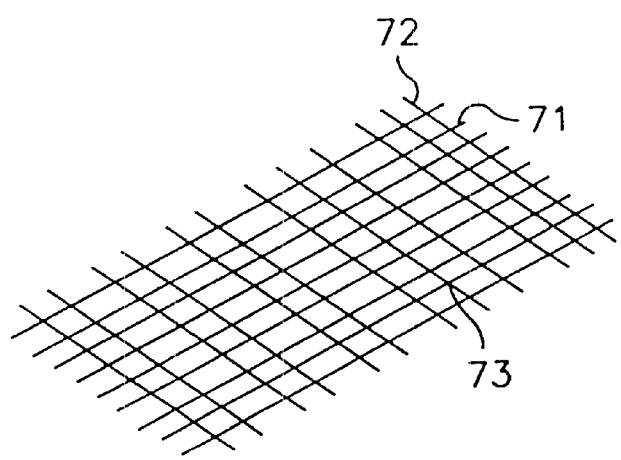
FIG. 28 is a schematic view similar to that of FIG. 17.

The electrical connection box and its contents are best shown in FIG. 26. Upper circuit board 10B is stacked over lower circuit board 10A. Terminal plates 15 and jumper terminals 21 are inserted through terminal grooves 77 in the manner previously described. Similarly, power supply busbar 18 with tabs 18a and solderless plate 18c having connection blades 18b is located above upper circuit board 10B. The electrical connection box is assembled by locking together upper case 17 and lower case 16.

Circuit boards 10A and 10B are stacked vertically and retained in lower case 16. The wires are laid on insulative plates 69 so that the insulative plates are on the lower sides thereof. Therefore, there is no difficulty in vertically stacking the boards adjacent to each other. When this is done, solderless plates 15A, projecting upward from lower circuit board 10A, extend through through-openings 78 of upper circuit board 10B and project upward thereof. Jumper terminals 21 extend through insertion openings 77 of upper circuit board 10B to form a solderless connection with the upper wire; this creates a jumper connection between the wires of circuit boards 10A and 10B. Solderless plates 15, which extend downward from upper circuit board 10B, extend through through-openings 78 in lower circuit board 10A and project downward into the terminal openings of the connector holder in lower case 16. The usual power supply busbar 18, of the same form and with the same connections as previously described, is disposed above upper circuit board 10B and beneath upper case 17. The cases 16 and 17 are then locked together to complete the assembly of the electrical connection box.

The production of circuit board 10 is shown in FIGS. 27 to 31. Longitudinal wires 71 are formed straight and with uniform lengths. They are extended parallel to each other at prescribed pitches along the Y direction. The pitch between longitudinal wires 71 matches pitch P6 for fuses, while the remaining conductors 71 are spaced apart at pitch 7 for relays. Lateral wires 72, also straight, parallel, and in uniform lengths, extend in the X direction. The pitch between certain lateral wires 72 matches pitch P8 for connector terminal openings, while the other lateral conductors are arranged at pitch P9 which corresponds to that of the medium connector terminal openings. The remaining wires are set to large terminal opening pitch P10. Electrical connections 73 are formed by welding, fusing, etc. at the intersections between the lateral and longitudinal wires as needed either for the desired circuit connections or for physically maintaining the rigidity of the lattice.

Figure 29:
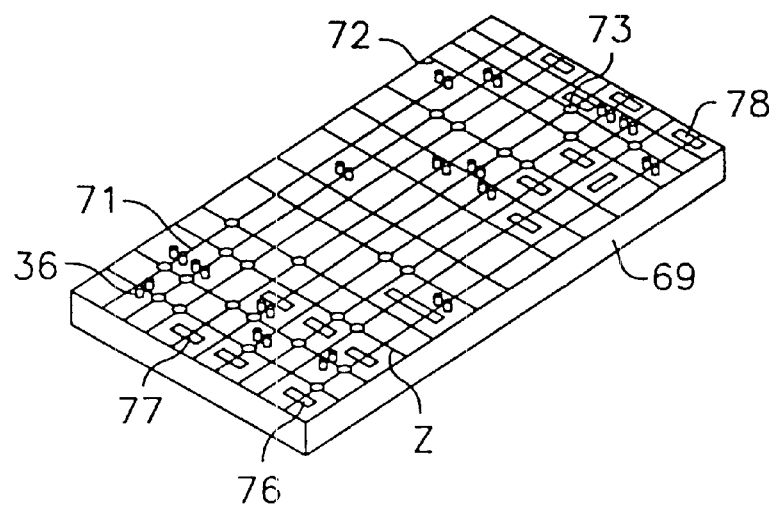
FIG. 29 is a view of the circuit board similar to that of FIG. 8.
Figure 33A:
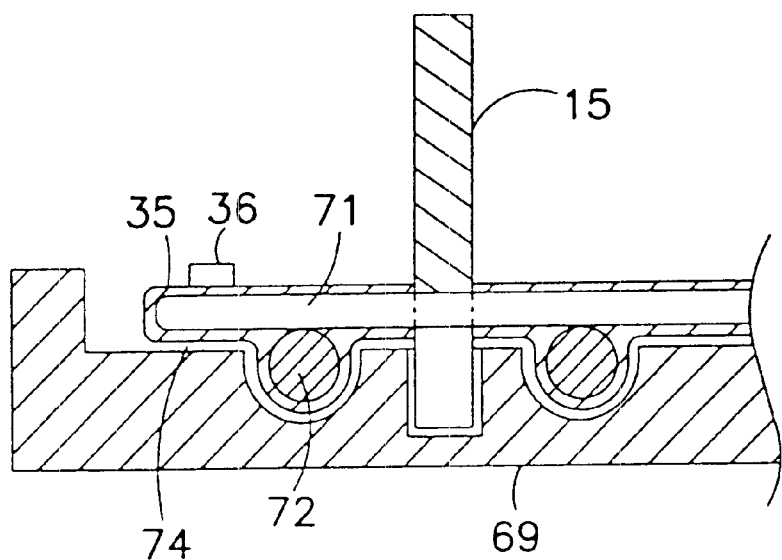
FIGS. 33(A) and 33(B) are enlarged schematic fragmentary cross sections of the circuit board made from the conductive member of FIG. 32(B)
Figure 33B:
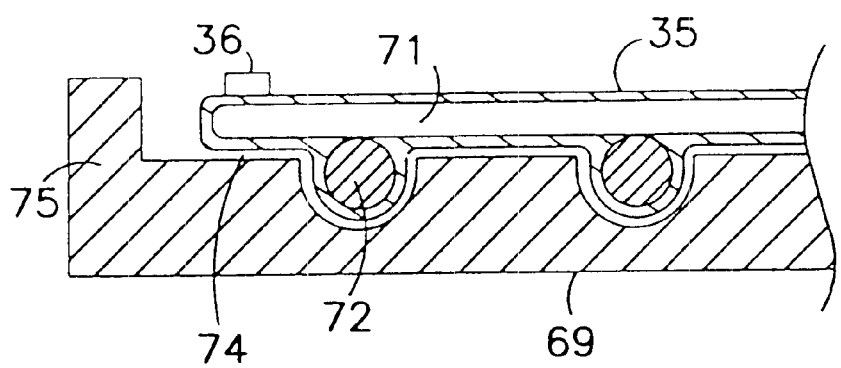
Figure 34A:
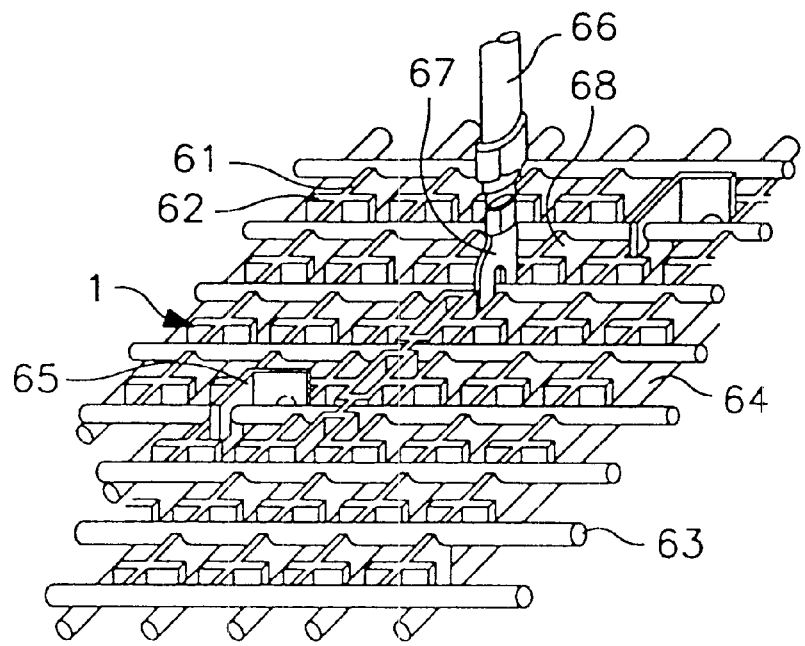
FIGS. 34(A), 34(B), and 34(c) are schematic views of the prior art.
Figure 34B:
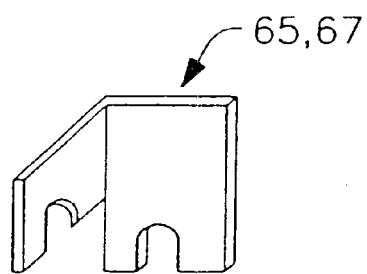
Figure 34C:
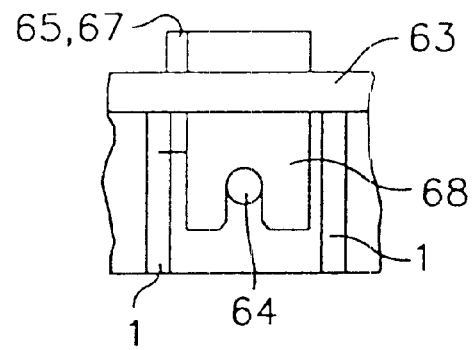

As shown in FIG. 29, the longitudinal and lateral wires are laid over each other to form a lattice which corresponds to the shape of the upper surface of insulative plate 69. The wires are fixed to the upper surface of the insulated plate by holding ribs 36. As shown in FIG. 33, side walls 75 project from the outer perimeter of the insulative plate and the wires are mounted on recessed upper surface 74. Holding ribs 36 receive the wires and retain them in their desired position.

Figure 30:
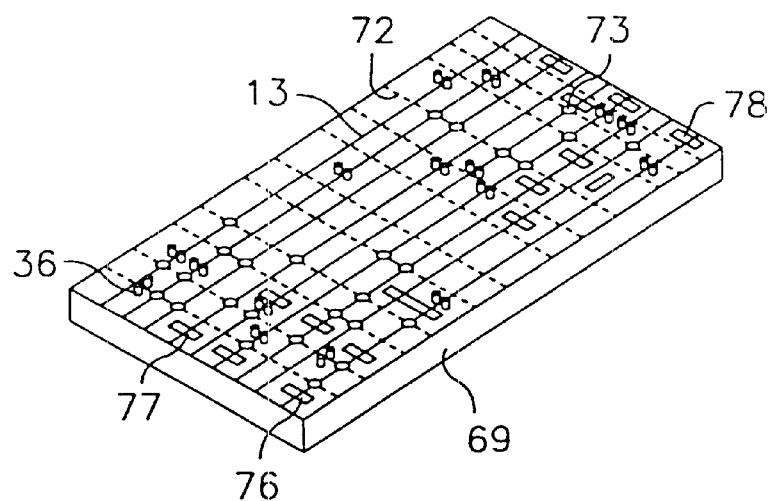
FIG. 30 is a view similar to that of FIG. 29 with unneeded portions of the conductive member cut away.

Insulative plate 69 is formed with insertion grooves 76 which allow the solderless terminals to be introduced from above. Terminal grooves 77 permit the solderless terminals to be inserted from below and, via through openings 78, allows introduction from either direction. The grooves and openings are positioned either along longitudinal wires 71 or at the intersection points of the longitudinal wires and the lateral wires. Thereafter, as best seen in FIG. 30, sections z which are not needed to form the desired circuits are cut away and removed. Alternatively, the removal can take place before mounting the conductors on the insulative plates.

Figure 31:
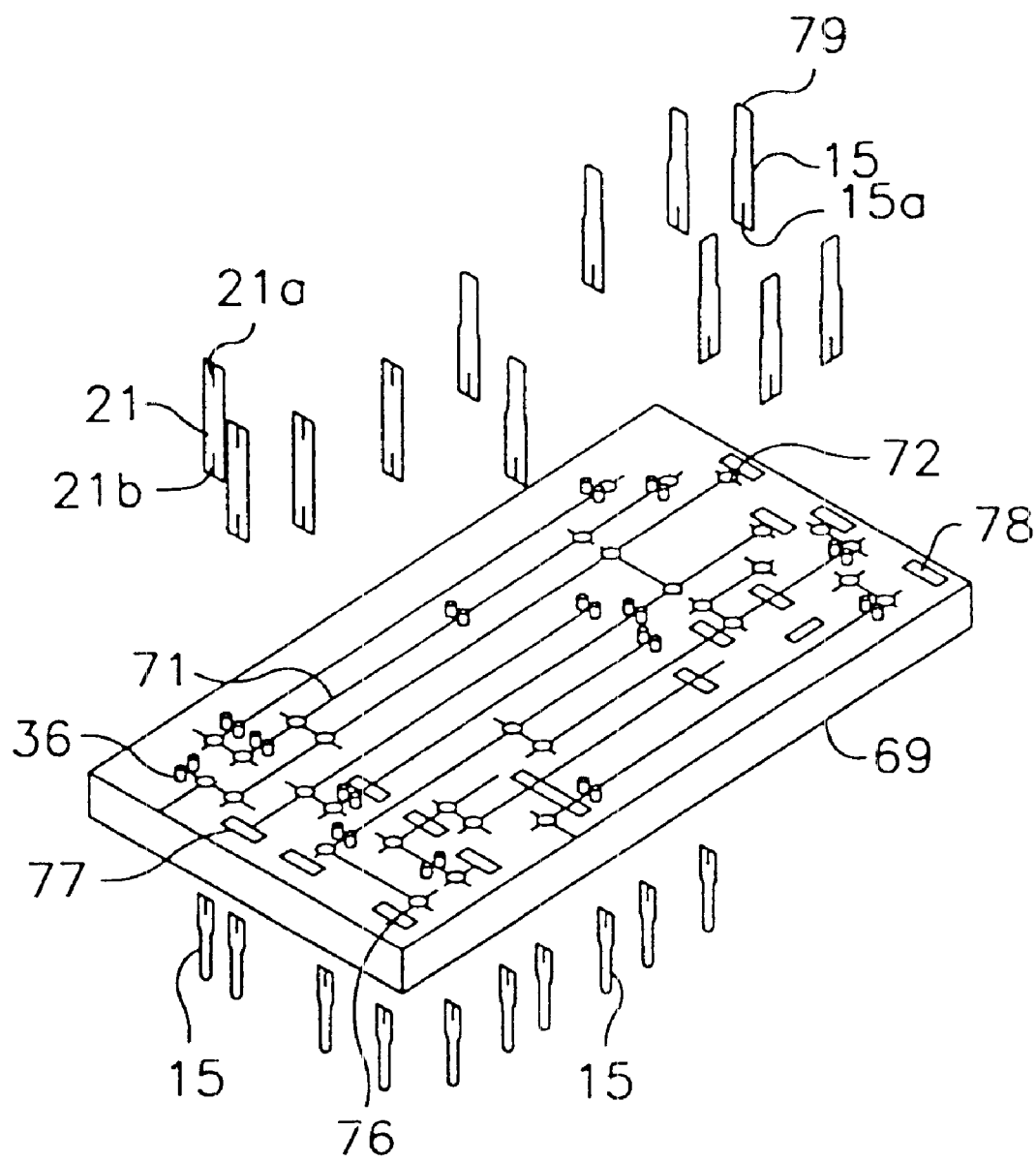
FIG. 31 is view similar to that of FIG. 9 showing insertion of the solderless terminals.
Figure 32A:
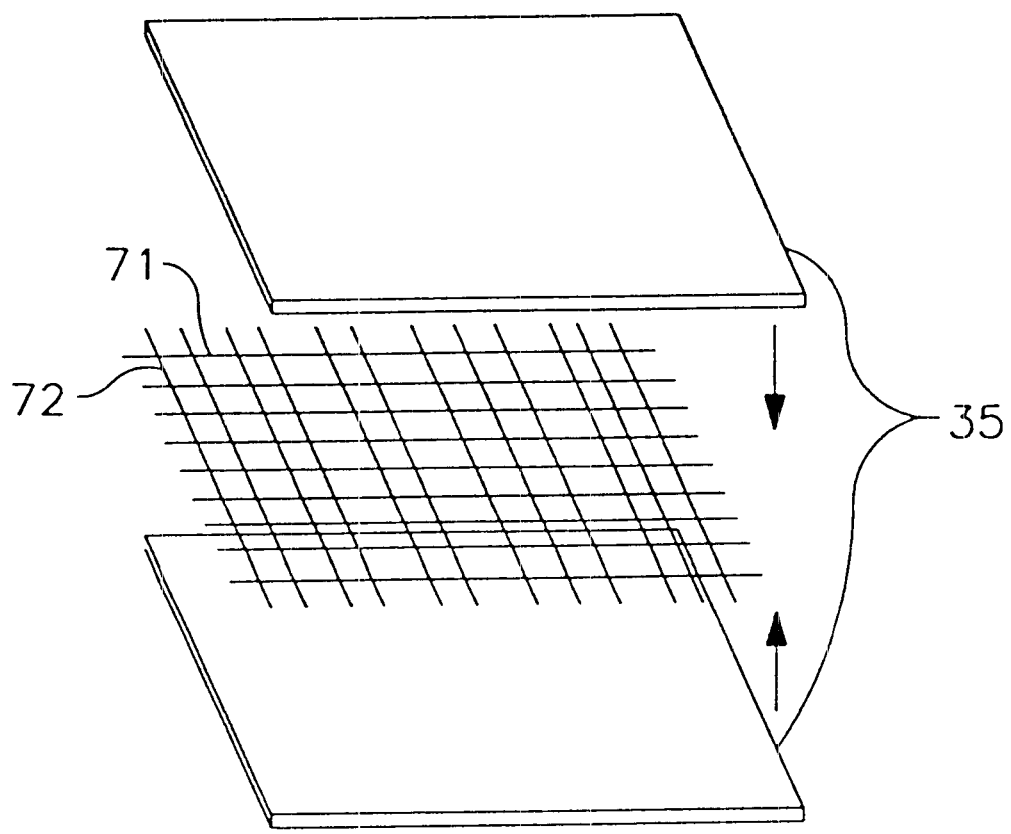
FIG. 32(A) is an exploded perspective view of the conductive member and the insulative films surrounding it.
Figure 32B:
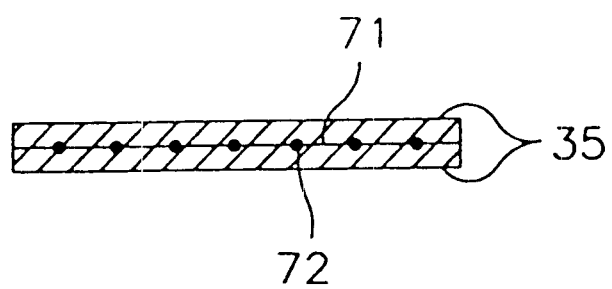
FIG. 32(B) is a cross section of the completed conductive member of FIG. 32(A)

In the next step, as shown in FIG. 31, terminal plates 15 and jumper terminals 21 are inserted at the prescribed positions, and connections are formed between the longitudinal and lateral wires. Terminal plates 15 are flat vertical plates and carry solderless connection blades 15a on one end thereof. On the other end, tab 79, serving as a male terminal, is provided. When the terminal plates are introduced from above the wiring side, terminal grooves 76 are used so that solderless connections with the appropriate wires are formed and the terminal plates project upward. On the other hand, if they are inserted from below, they are introduced into openings 77 to form the solderless connections and they project downward. Jumper terminals 21, having solderless connection blades 21a and 21b at each end, are inserted into terminal grooves 76 and openings 77 as the particular circuits require.

As can be seen in FIGS. 32(A), 32(B), 33(A), and 33(B), longitudinal and lateral wires 71 and 72 are layered in the lattice formation. The intersections are bonded, by welding or any other suitable means. Thereafter, the front and back surfaces of the lattice are covered with insulative films 35. The portions of the wires unnecessary to provide the desired circuitry are then cut away and removed. Alternatively, these portions can be excised before resin films 35 are applied. The resin films not only provide the desired insulation between adjacent layers of latticed wires, but also assist in maintaining the rectangular shape thereof. The resulting "sandwich" is particularly thin and is thereafter mounted and fixed on insulative plate 69 (see FIG. 33). The insulative plate may be provided with suitable grooves to receive longitudinal wires 71 and/or lateral wires 72. Preferably, insulative plate 69 is recessed as shown in FIG. 33 in order to assist in fixing and retaining the insulated lattice in place. If solderless plates 15 are used to make desired connections, resin film 35 is punctured to allow the solderless connection to be completed. As a result, insulative film 35 protects against any possible short circuits and permits the provision of many circuits within a relatively small electrical connection box.

Moreover, it would be possible to place longitudinal and lateral wires 71 and 72 on both the upper and lower surfaces of insulative plate 69. Furthermore, one or more of the lattices could be replaced by appropriately designed busbars. Although the Invention has been described with relation to solid-core wires, insulated wires and/or multi-strand wires are also suitable.

The present Invention provides numerous important advantages. The insulative plate can be of a simple shape which can be used regardless of the particular circuit being provided. This provides economies in the manufacture of the molds used in making the insulative plates, as well as eliminating the need for stocking more than one type of insulative plate. Since the wires are straight, have uniform lengths, and are arranged parallel to each other at predetermined pitches, the entire wiring operation and assembly is facilitated and the need for complex and expensive equipment is also eliminated or minimized.

A further advantage resides in the ease with which the circuits can be modified. The combination of lattice structures, terminal plates, and jumper terminals provides the desired flexibility. Moreover, the unneeded portions of the lattices can be cut away, thereby contributing to size reduction. The terminal plates provide good connection points to external circuits and the layered configuration permits high circuit density, i.e. many circuits can be accommodated within a relatively small volume. In addition, the connections within the electrical connection box can be made reliably and readily by standard operations such as welding, fusing, etc.

Although only a limited number of embodiments of the present Invention have been expressly disclosed, it is, nonetheless, to be broadly construed, and not to be limited except by the character of the claims appended hereto.

We claim:

1. A circuit board assembly for enclosure in an electrical connection box in a vehicle, comprising:

a first plurality of lateral wires substantially parallel to each other, a second plurality of longitudinal wires substantially parallel to each other, said first plurality of lateral wires layered on and substantially perpendicular to said second plurality of longitudinal wires whereby said lateral wires and said longitudinal wires intersect and are welded to each other to make electrical connections therebetween at intersection points, to form a conductive material, said conductive material attached to an upper surface of a planar insulative plate by holding ribs, sections of said conductive material not needed for a circuit being cut away, and solderless terminals fixed to said lateral wires and said longitudinal wires at predetermined positions, wherein said solderless terminals comprise terminal plates and jumper terminals, said terminal plates having a tab at one end, and connection blades at another end, said jumper terminals having solderless connection blades at both ends, said solderless terminals forming solderless electrical connections at said predetermined points, said solderless terminals being inserted from one or both sides of said insulative plate, and said tab arranged to project into a terminal opening of an adjacent connection box for connection to electrical elements of external circuits.

2. The circuit board assembly of claim 1 wherein each side of said conductive member is covered by an insulative film.

3. The circuit board assembly of claim 1 wherein said lateral wires are spaced apart from each other at prescribed pitches and said longitudinal wires are spaced apart from each other at predetermined pitches, said prescribed pitches and said predetermined pitches corresponding to terminal opening pitches for electrical elements to which said lateral wires and said longitudinal wires are to be connected.

\* \* \* \* \*